(12) United States Patent
Chen

(10) Patent No.: US 12,068,168 B2
(45) Date of Patent: Aug. 20, 2024

(54) PROCESSES FOR REDUCING LINE-END SPACING

(71) Applicant: Taiwan Semiconductor Manufacturing Co., Ltd., Hsinchu (TW)

(72) Inventor: Wen-Yen Chen, Chu Tung Township (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 197 days.

(21) Appl. No.: 17/664,732

(22) Filed: May 24, 2022

(65) Prior Publication Data

US 2023/0260795 A1 Aug. 17, 2023

Related U.S. Application Data

(60) Provisional application No. 63/268,179, filed on Feb. 17, 2022.

(51) Int. Cl.
| | |
|---|---|
| H01L 21/308 | (2006.01) |
| H01L 21/033 | (2006.01) |
| H01L 21/306 | (2006.01) |
| H01L 21/311 | (2006.01) |
| H01L 21/3213 | (2006.01) |
| H01L 21/768 | (2006.01) |

(52) U.S. Cl.
CPC ...... *H01L 21/3086* (2013.01); *H01L 21/0332* (2013.01); *H01L 21/0337* (2013.01); *H01L 21/0338* (2013.01); *H01L 21/30604* (2013.01); *H01L 21/3088* (2013.01); *H01L 21/31116* (2013.01); *H01L 21/31144* (2013.01); *H01L 21/32139* (2013.01); *H01L 21/76802* (2013.01); *H01L 21/76811* (2013.01); *H01L 21/76813* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 10,157,775 B2 | 12/2018 | Chen et al. | |
| 10,840,131 B2 | 11/2020 | Peng et al. | |
| 11,676,821 B2 * | 6/2023 | Huang | H01L 21/76816 438/598 |

FOREIGN PATENT DOCUMENTS

| | | |
|---|---|---|
| TW | I687977 B | 3/2020 |
| TW | I731122 B | 6/2021 |

* cited by examiner

*Primary Examiner* — Jiong-Ping Lu
(74) *Attorney, Agent, or Firm* — Slater Matsil, LLP

(57) ABSTRACT

A method includes forming an etching mask to cover a mandrel, a first spacer, and a second spacer, and the first spacer and the second spacer are in contact with opposing sidewalls of the mandrel. The etching mask is then patterned, and includes a first portion covering the first spacer, a second portion covering the second spacer, and a bridge portion connecting the first portion to the second portion. The bridge portion has first sidewalls. A first etching process is performed on the mandrel using the etching mask to define pattern, and after the first etching process, the mandrel includes a second bridge portion having second sidewalls vertically aligned to corresponding ones of the first sidewalls. After the mandrel is etched-through, a second etching process is performed to laterally recess the second bridge portion of the mandrel.

20 Claims, 32 Drawing Sheets

PROCESSES FOR REDUCING LINE-END SPACING

PRIORITY CLAIM AND CROSS-REFERENCE

This application claims the benefit of the following provisionally filed U.S. Patent application: Application No. 63/268,179, filed on Feb. 17, 2022, and entitled "Line End Push Approach," which application is hereby incorporated herein by reference.

BACKGROUND

Integrated circuits include interconnect structures, which may include metal lines and vias to serve as three-dimensional wiring structures. The function of the interconnect structures is to properly connect densely packed devices together.

The metal lines and vias are formed in the interconnect structure. The metal lines and vias are typically formed by damascene processes. A damascene process may include forming trenches and via openings in dielectric layers, depositing a barrier layer, followed by the filling of the trenches and via openings with conductive materials. After a Chemical Mechanical Polish (CMP) process, the top surfaces of the metal lines are leveled, leaving the metal lines and vias in the trenches and the via openings, respectively. It is a challenging work to reduce the scale of metal lines and vias in a controllable manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
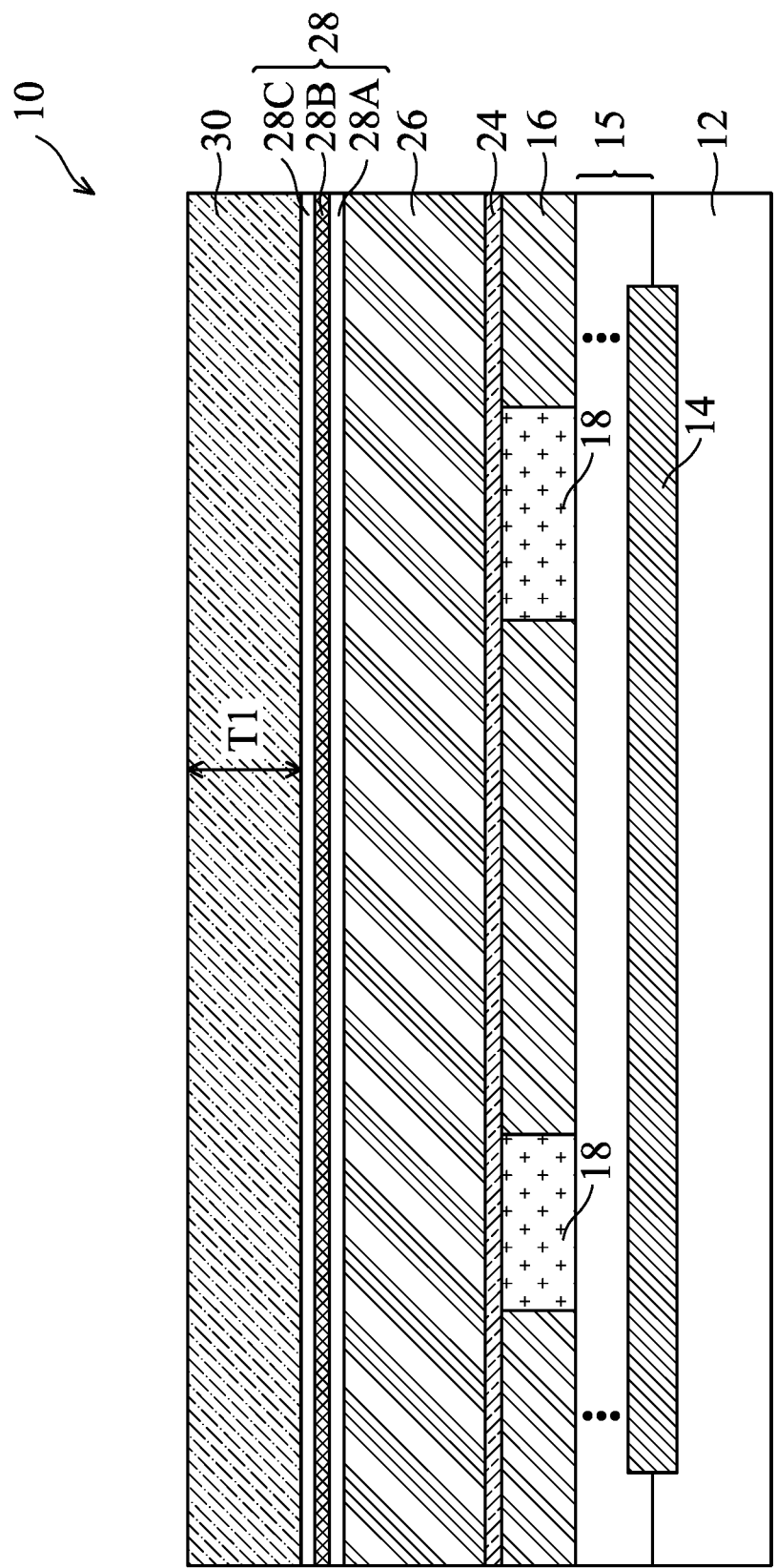
FIGS. 1, 2A, 2B, 3, 4A, 4B, 5A, 5B, 6A, 6B, 7A, 7B, 7C, 8A, 8B, 8C, 8D, 9A, 9B, 9C, 10A, 10B, 10C, 11A, 11B, 12A, 12B, 13A, 13B, 13C, and 14 illustrate the cross-sectional views, top views, and a perspective view of intermediate stages in the formation of an interconnect structure including metal lines and vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming an interconnect structure including metal lines with small line-end spacing is provided. In accordance with some embodiments, a plurality of mandrels are formed of a first material. Spacers are formed on the sidewalls of the mandrels, with the spacers being formed of a second material different from the first material. A mandrel between two spacers is patterned, leaving a bridging portion, which physically interconnects the two spacers. In the patterning of the mandrel, the etching gas is selected so that a first etching rate of the mandrel is significantly higher than a second etching rate of the spacers. After the mandrel is fully patterned, the bridging portion is lateral etched to reduce the width of the bridging portion, while the spacing between the two spacers is substantially not reduced. Through the lateral etching process, the line-end spacing may be reduced without increasing the line widths of the resulting metal lines. Although the formation of metal lines are used as an example, the embodiments may also be applied to the formation of other types of features including, and not limited to, dielectric features, polysilicon, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1, 2A, 2B, 3, 4A, 4B, 5A, 5B, 6A, 6B, 7A, 7B, 7C, 8A, 8B, 8C, 8D, 9A, 9B, 9C, 10A, 10B, 10C, 11A, 11B, 12A, 12B, 13A, 13B, 13C, and 14 illustrate the cross-sectional views, top views, and a perspective view of intermediate stages in the formation of an interconnect structure including metal lines in accordance with some embodiments. The corresponding processes are also reflected schematically in the process flow 200 as shown in FIG. 15.

FIG. 1 illustrates a cross-sectional view of wafer 10, wherein the illustrated portion is a part of a device die in wafer 10. In accordance with some embodiments, wafer 10 is a device wafer including active devices such as transistors and/or diodes, and possibly passive devices such as capacitors, inductors, resistors, and/or the like. In accordance with alternative embodiments, wafer 10 may be an interposer wafer free from active devices, which may include, or may be free from, passive devices. Wafer 10 may also be a reconstructed wafer including device dies, packages, or the like, which are encapsulated in an encapsulant such as a molding compound.

In accordance with some embodiments, wafer 10 includes semiconductor substrate 12 and the features formed at a top surface of semiconductor substrate 12. Semiconductor substrate 12 may be formed of a crystalline semiconductor material such as silicon, germanium, silicon germanium, and/or a III-V compound semiconductor such as GaAsP, AlInAs, AlGaAs, GaInAs, GaInP, GaInAsP, or the like. Semiconductor substrate 12 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 12. Although not shown, through-vias may be formed to extend into semiconductor substrate 12, wherein the through-vias are used to electrically intercouple the features on opposite sides of semiconductor substrate 12. Active devices 14, which may include transistors, are formed at the top surface of semiconductor substrate 12.

Dielectric layer 16 is formed over substrate 12. In accordance with some embodiments, dielectric layer 16 is formed of or comprises a low-k dielectric material having a dielectric constant (k-value) lower than about 3.5 or lower than about 3.0. Dielectric layer 16 may be formed of a carbon-containing low-k dielectric material, Hydrogen SilsesQuioxane (HSQ), MethylSilsesQuioxane (MSQ), and/or the like. In accordance with some embodiments, the formation of dielectric layer 16 includes depositing a porogen-containing dielectric material and then performing a curing process to drive out the porogen, and hence the remaining dielectric layer 16 is porous.

Conductive features 18 are formed in dielectric layer 16. In accordance with some embodiments, each of conductive features 18 includes a diffusion barrier layer and a copper-containing material over the diffusion barrier layer. The diffusion barrier layer may be formed of titanium, titanium nitride, tantalum, tantalum nitride, or the like, and has the function of preventing copper in the copper-containing material from diffusing into dielectric layer 16. Alternatively, conductive features 18 may be barrier-less, and may be formed of cobalt, tungsten, or the like. Conductive features 18 may have a single damascene structure or a dual damascene structure.

In accordance with some embodiment, dielectric layer 16 is an Inter-Metal Dielectric (IMD) layer, and conductive features 18 are metal lines and/or vias. In accordance with alternative embodiments, dielectric layer 16 is an Inter-Layer Dielectric (ILD) layer, and conductive features 18 are contact plugs. There may be, or may not be, additional features between dielectric layer 16 and devices 14, and the additional features are represented as structure 15, which may include dielectric layers such as a contact etch stop layer(s), an inter-layer dielectric, an etch stop layer(s), and an IMD(s). Structure 15 may also include contact plugs, vias, metal lines, etc.

Dielectric layer 24 is deposited over dielectric layer 16 and conductive features 18. Dielectric layer 24 may be used as an Etch Stop Layer (ESL), and hence is referred to as etch stop layer 24 or ESL 24 throughout the description. Etch stop layer 24 may include a nitride, a silicon-carbon based material, a carbon-doped oxide, or a metal-containing dielectric such as SiCN, SiOCN, SiOC, $AlO_x$, AlN, AlCN, or the like, or combinations thereof. Etch stop layer 24 may be a single layer formed of a homogeneous material, or a composite layer including a plurality of dielectric sub-layers. In accordance with some embodiments, etch stop layer 24 includes an aluminum nitride (AlN) layer, a SiOC layer over the AlN layer, and an aluminum oxide ($AlO_x$) layer over the SiOC layer.

Dielectric layer 26 is deposited over ESL 24. In accordance with some embodiments, dielectric layer 26 is formed of a silicon-containing dielectric material such as silicon oxide. Dielectric layer 26 may also be formed of a low-k dielectric material, and hence is referred to as low-k dielectric layer 26 hereinafter. Low-k dielectric layer 26 may be formed using a material selected from the same (or different) group of candidate materials for forming dielectric layer 16. When selected from the same group of candidate materials, the materials of dielectric layers 16 and 26 may be the same as each other or different from each other.

Mask layers 28A, 28B, and 28C are formed over dielectric layer 26 in accordance with some embodiments. The respective process is illustrated as process 202 in the process flow 200 as shown in FIG. 15. It is appreciated that the illustrated mask layers 28A, 28B, and 28C are examples, and different layer schemes may be used. Mask layers 28A, 28B, and 28C are individually and collectively referred to as mask layers 28 hereinafter. In accordance with some embodiments, mask layers 28A and 28C are formed of or comprise a non-metal-containing dielectric such as silicon oxide, which may be formed, for example, using tetra ethyl ortho silicate (TEOS) as a precursor.

Mask layer 28B is deposited after the deposition of mask layer 28A, and before the deposition of mask layer 28C. Mask layer 28B may comprise a metal nitride, such as titanium nitride, tantalum nitride, tungsten nitride, titanium carbide, tantalum carbide, tungsten carbide, or the like. Mask layers 28 may be formed using Chemical Vapor Deposition (CVD), Plasma Enhance Chemical Vapor Deposition (PECVD), Sub Atmosphere Chemical Vapor Deposition (SACVD), or the like. Mask layers 28 may have a thickness in the range between about 50 Å and about 500 Å.

Next, mandrel layer 30 is deposited. The respective process is illustrated as process 204 in the process flow 200 as shown in FIG. 15. Mandrel layer 30 may be formed of or comprise amorphous silicon, amorphous carbon, tin oxide, silicon oxide, silicon nitride, silicon oxynitride, or the like, and other materials may be used. Mandrel layer 30 may be deposited as a blanket layer, which may be a planar layer having a uniform thickness. The thickness T1 of mandrel layer 30 may be in the range between about 10 nm and about 40 nm, and may be in the range between about 25 nm and about 40 nm in accordance with some embodiments.

Figure 2A:
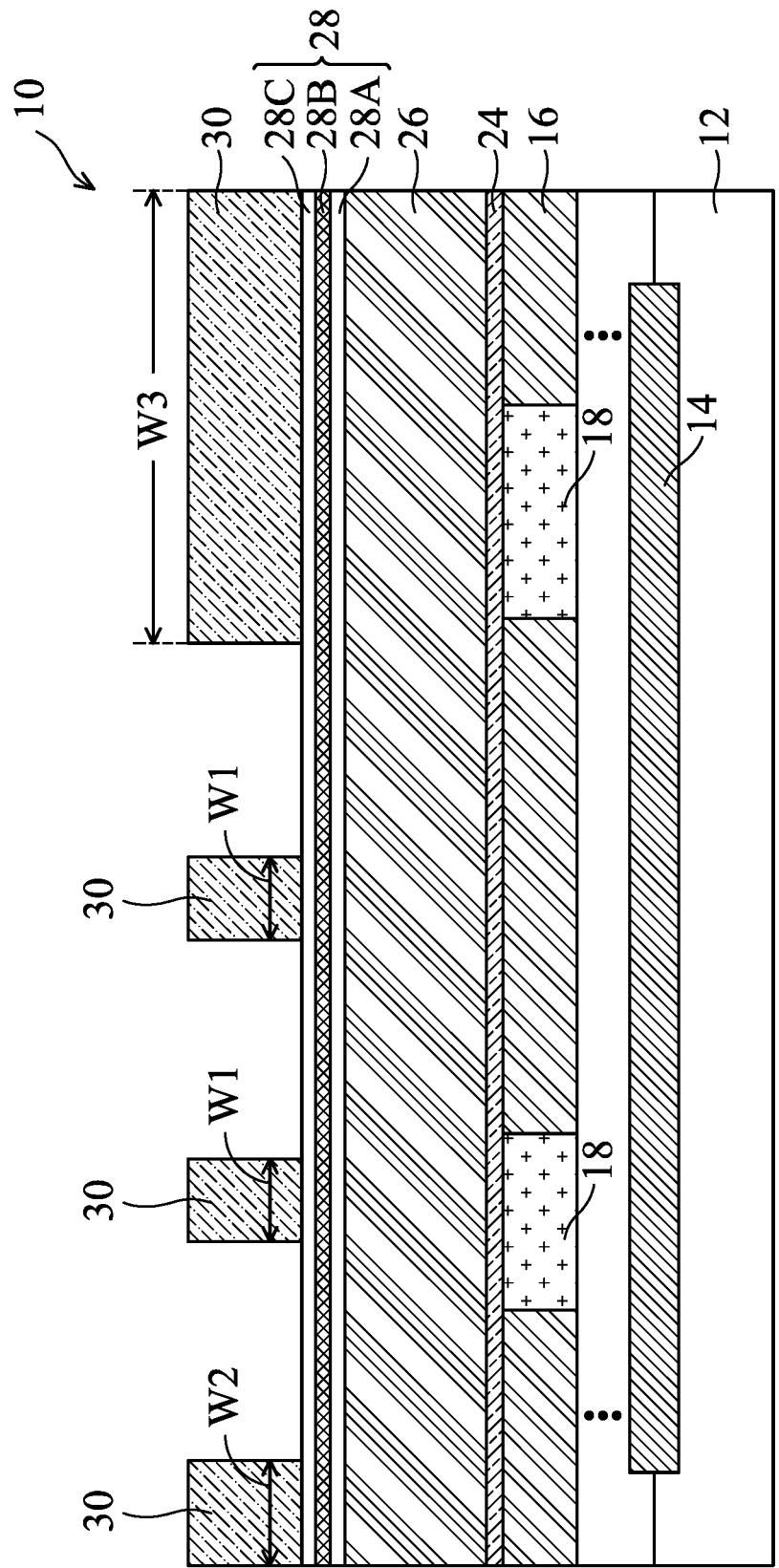
Figure 2B:
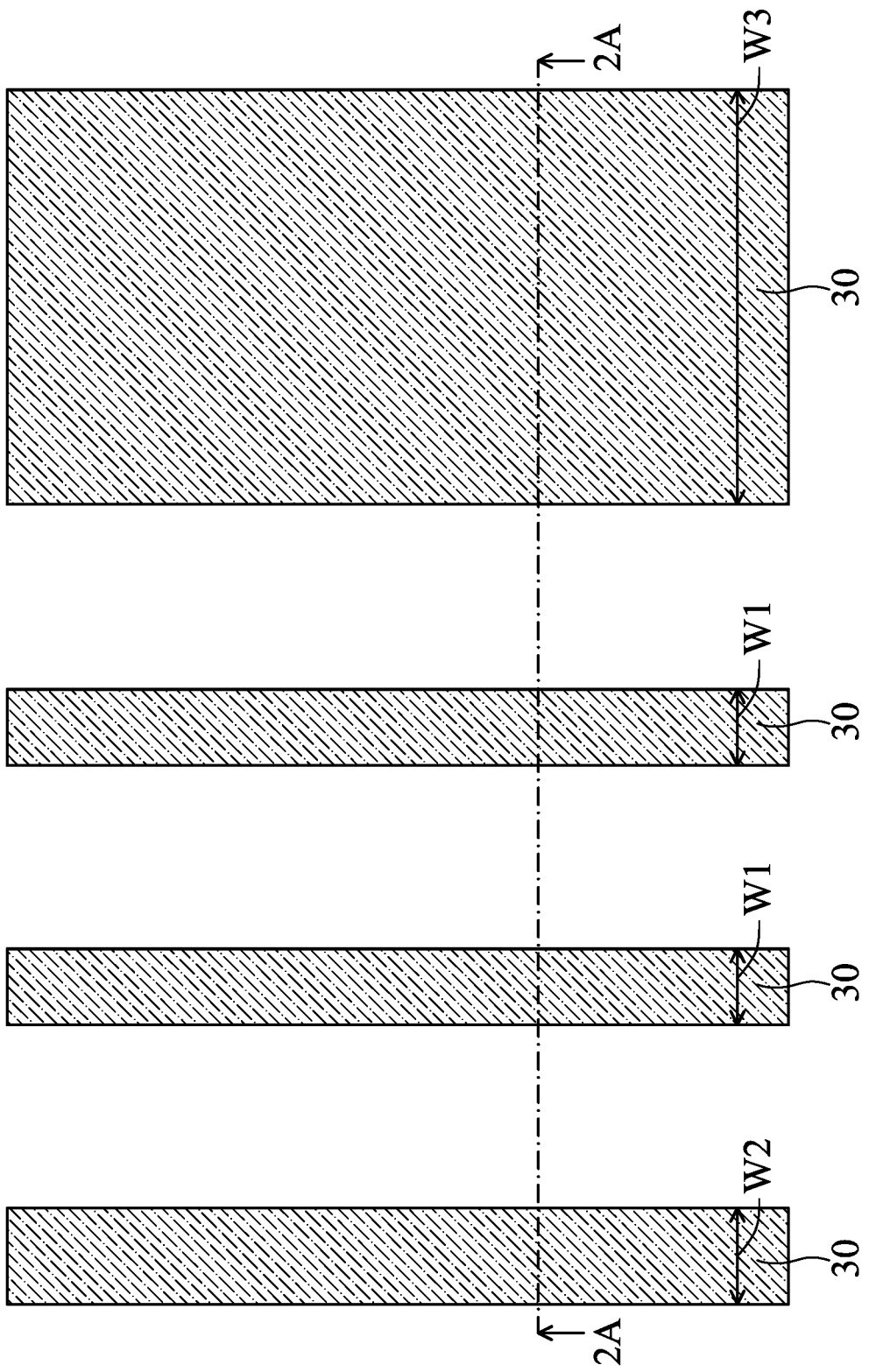

Next, an etching process is performed to pattern the blanket mandrel layer 30, and to form mandrels 30, as shown in FIGS. 2A and 2B. The respective process is illustrated as process 206 in the process flow 200 as shown in FIG. 15. FIG. 2B illustrates a top view of the structure shown in FIG. 2A, and FIG. 2A illustrates the cross-section 2A-2A in FIG. 2B. There may be a plurality of mandrels 30 having different widths formed. For example, the illustrated middle two mandrels 30 have widths W1, which may be equal to, or may be greater than, the minimum line width (critical dimension) that can be achieved using the formation technology. The illustrated leftmost and the rightmost mandrels 30 may have widths W2 and W3 greater than the minimum line width.

Figure 3:
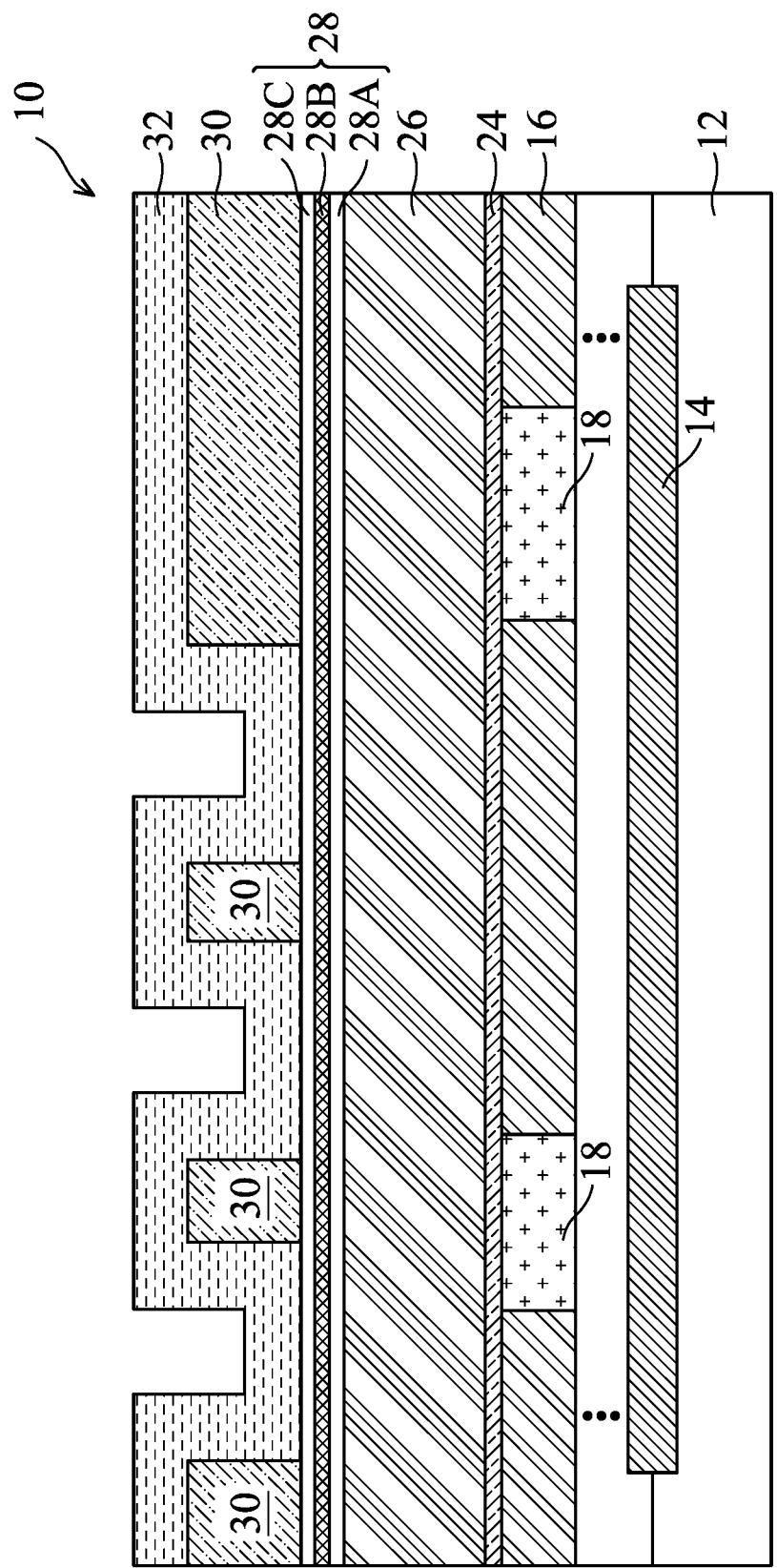

Referring to FIG. 3, spacer layer 32 is deposited. The respective process is illustrated as process 208 in the process flow 200 as shown in FIG. 15. The deposition process includes a conformal deposition process such as CVD, ALD, or the like. The material of spacer layer 32 is selected to be different from the material of mandrels 30, so that in the subsequent line-end pushing process (FIGS. 8A, 8B, and 8C), the etching selectivity of mandrels 30 and the spacers 32 (FIGS. 4A and 4B) is as high as possible, for example, greater than 5, greater than 10, or even greater. In accordance with some embodiments, spacer layer 32 is formed of or comprises a metal oxide or a metal nitride, for example, titanium oxide, titanium nitride, or the like.

Figure 4A:
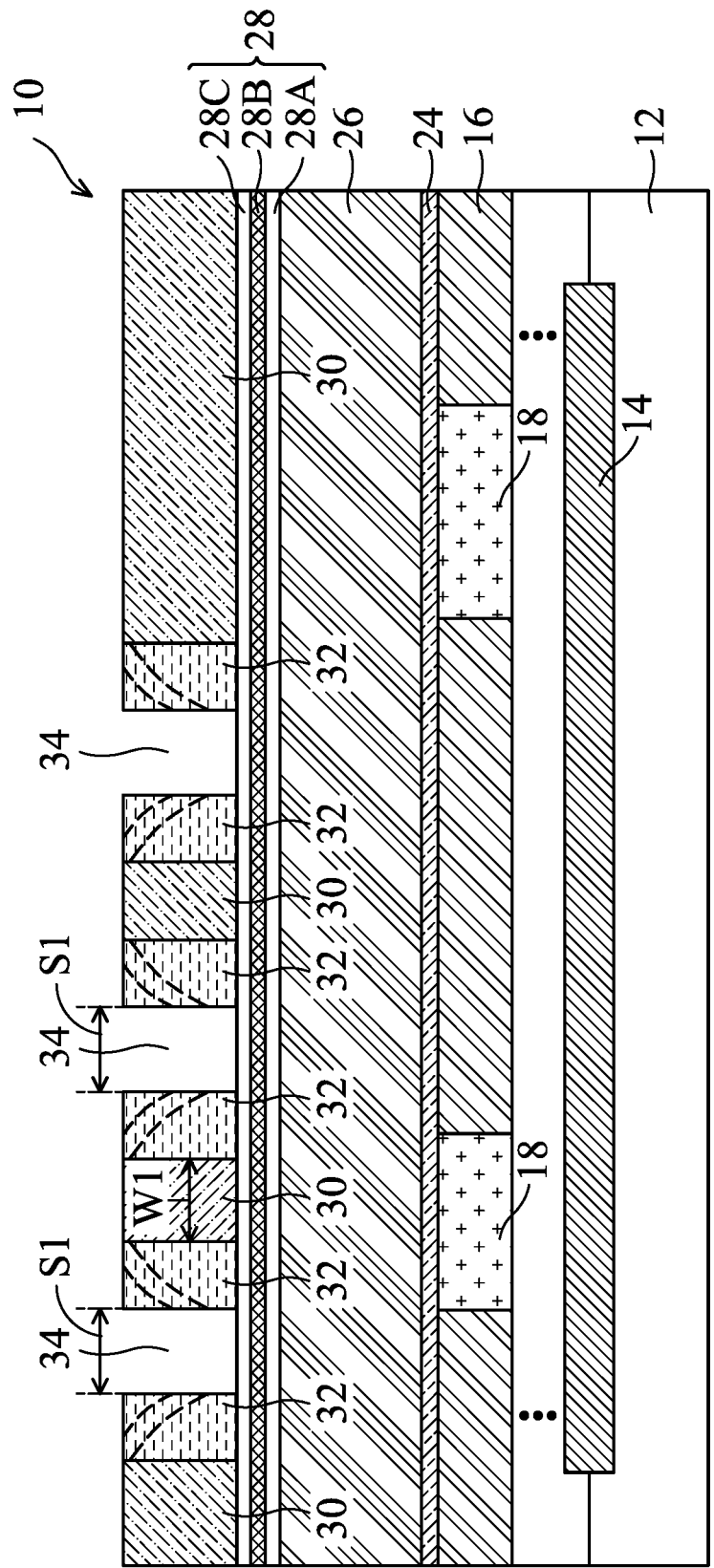
Figure 4B:
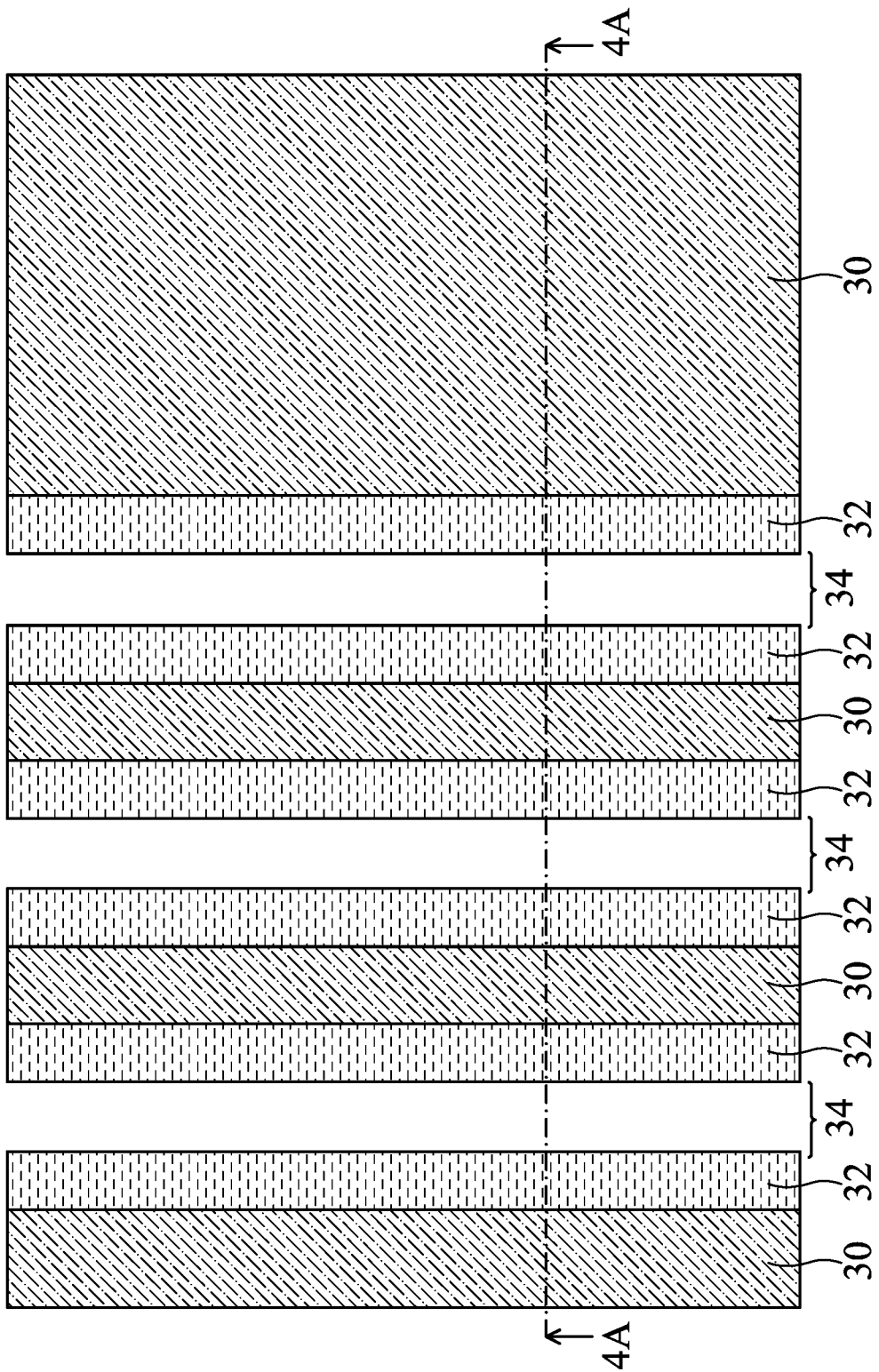

Next, an anisotropic etching process is performed to etch spacer layer 32. The respective process is illustrated as process 210 in the process flow 200 as shown in FIG. 15. The remaining portions of spacer layer 32 form spacers 32, as shown in FIGS. 4A and 4B. FIG. 4B illustrates a top view of the structure shown in FIG. 4A, and FIG. 4A illustrates the cross-section 4A-4A in FIG. 4B. Although FIG. 4A shows that the cross-sectional views of spacers 32 have sharp corners, the corners may be curved, as illustrated using dashed lines. The topmost ends of spacers 32 may also be level with or lower than the top surfaces of mandrels 30, as also illustrated using dashed line. In accordance with some embodiments, the anisotropic etching process is performed using etching gases such as $Cl_2$, HBr, $CH_4$, or the like, or combinations thereof. Carrier gases such as $N_2$, argon, or the like, may also be added into the etching gases. The spacers 32 formed on the neighboring mandrels 30 have spaces 34 in between, which may have spacings S1 in the range between about 0.5W1 and about 1.5W1.

Figure 5A:
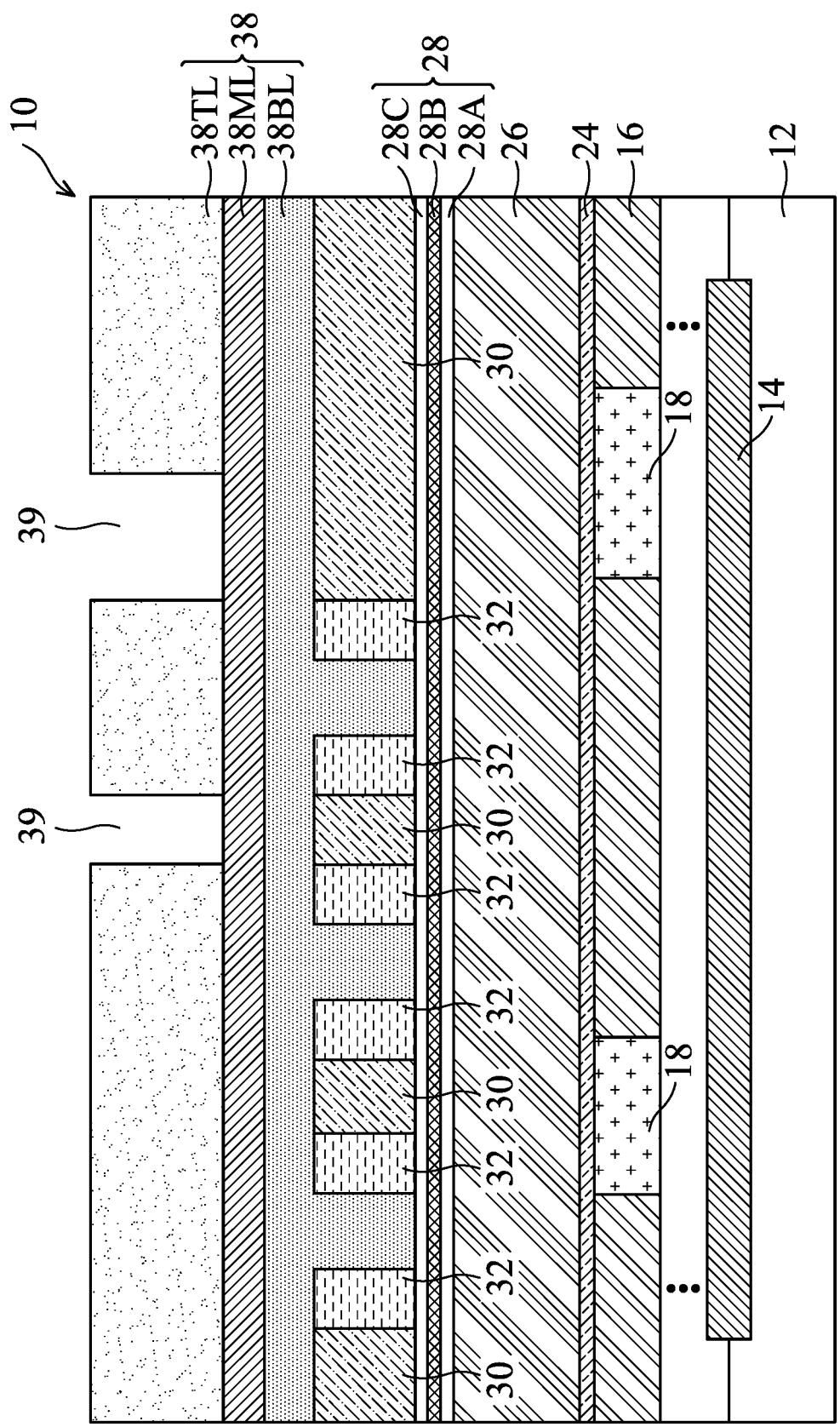
Figure 5B:
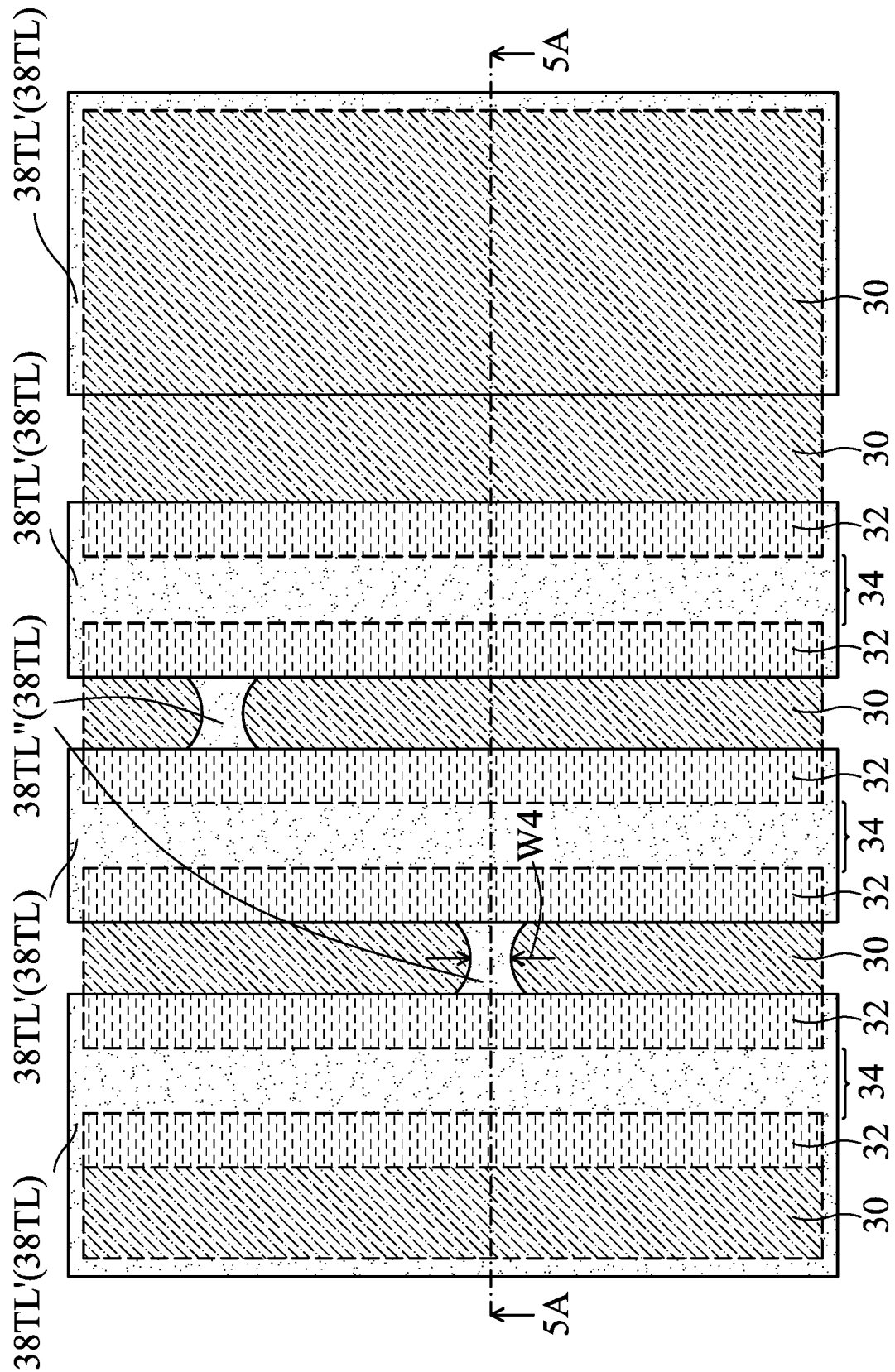

FIGS. 5A and 5B illustrate a cross-sectional view and a top view, respectively, of etching mask 38. The respective process is illustrated as process 212 in the process flow 200 as shown in FIG. 15. In accordance with some embodiments, etching mask 38 is a tri-layer, while other types such as a single-layer etching mask, a double-layer etching mask, a quadruple-layer etching mask, or the like may also be used. Etching mask 38 may include bottom layer (also sometimes referred to as an under layer) 38BL, middle layer 38ML over bottom layer 38BL, and top layer 38TL (also sometimes referred to as an upper layer) over middle layer 38ML.

In accordance with some embodiments, bottom layer 38BL and top layer 38TL are formed of photo resists, with the bottom layer 38BL being cross-linked already. Middle layer 38ML may be formed of an inorganic material, which may be a nitride (such as silicon nitride), an oxynitride (such as silicon oxynitride), an oxide (such as silicon oxide), or the like. Middle layer 38ML has a high etching selectivity with relative to top layer 38TL and bottom layer 38BL, and hence top layer 38TL may be used as an etching mask for patterning middle layer 38ML, and middle layer 38ML may be used as an etching mask for patterning bottom layer 38BL. Top layer 38TL is patterned to form openings 39, which are used to define trenches in low-k dielectric layer 26. The lithography process in the patterning may be performed using an extreme Ultra-Violet (EUV) light, for example, with 193 nm wavelength.

As shown in FIG. 5A, middle layer 38ML and bottom layer 38BL are blanket layers that are not patterned. Referring to FIG. 5B, top layer 38TL may include bulk portions 38TL' and bridge portions 38TL" interconnecting bulk portions 38TL'. The width W4 of bridge portions 38TL" may be equal to or greater than the minimum width allowed by the formation technology. For example, when the exposing wavelength is 193 nm, width W4 may be equal to about 23 nm.

Figure 6A:
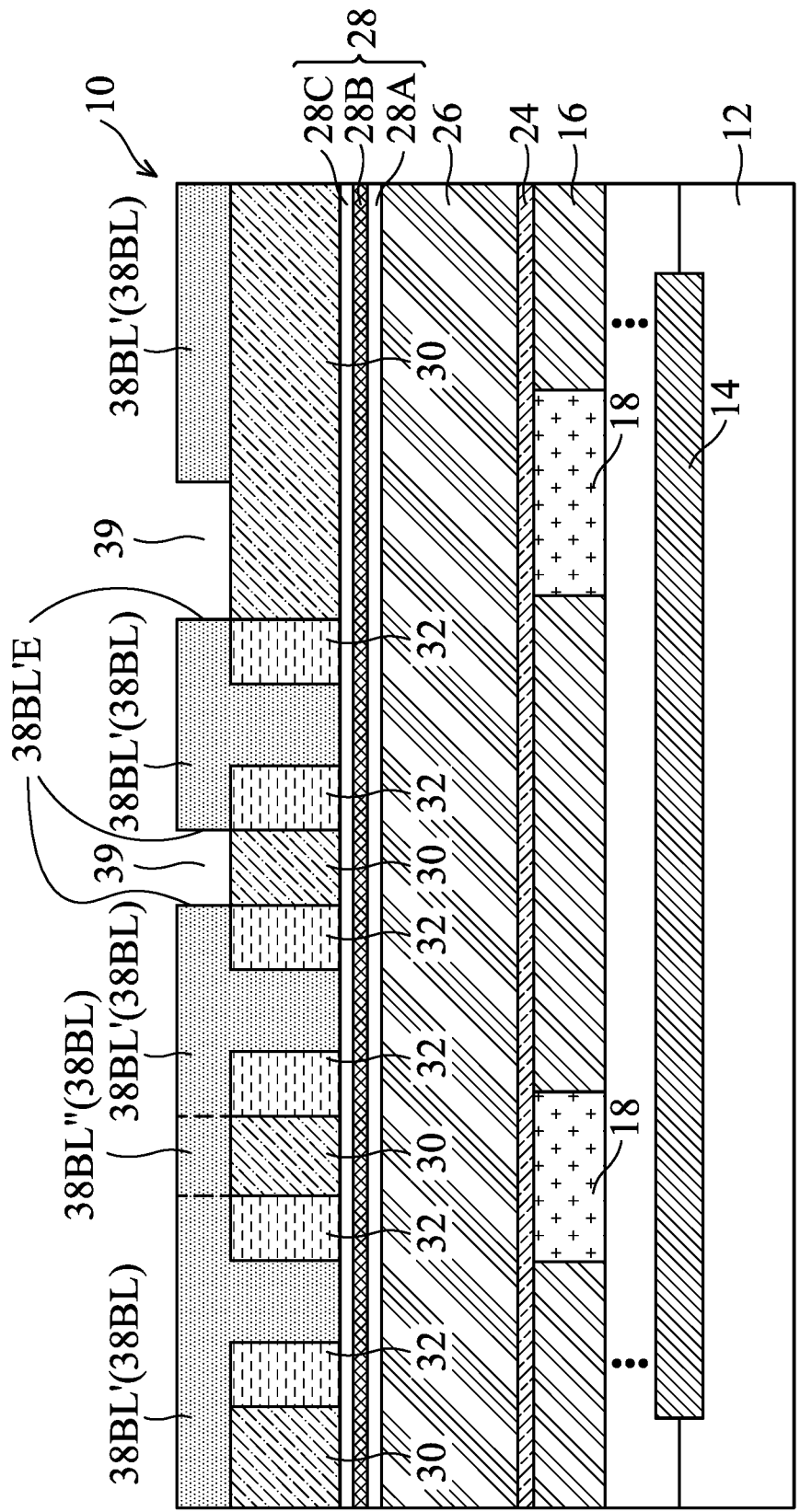
Figure 6B:
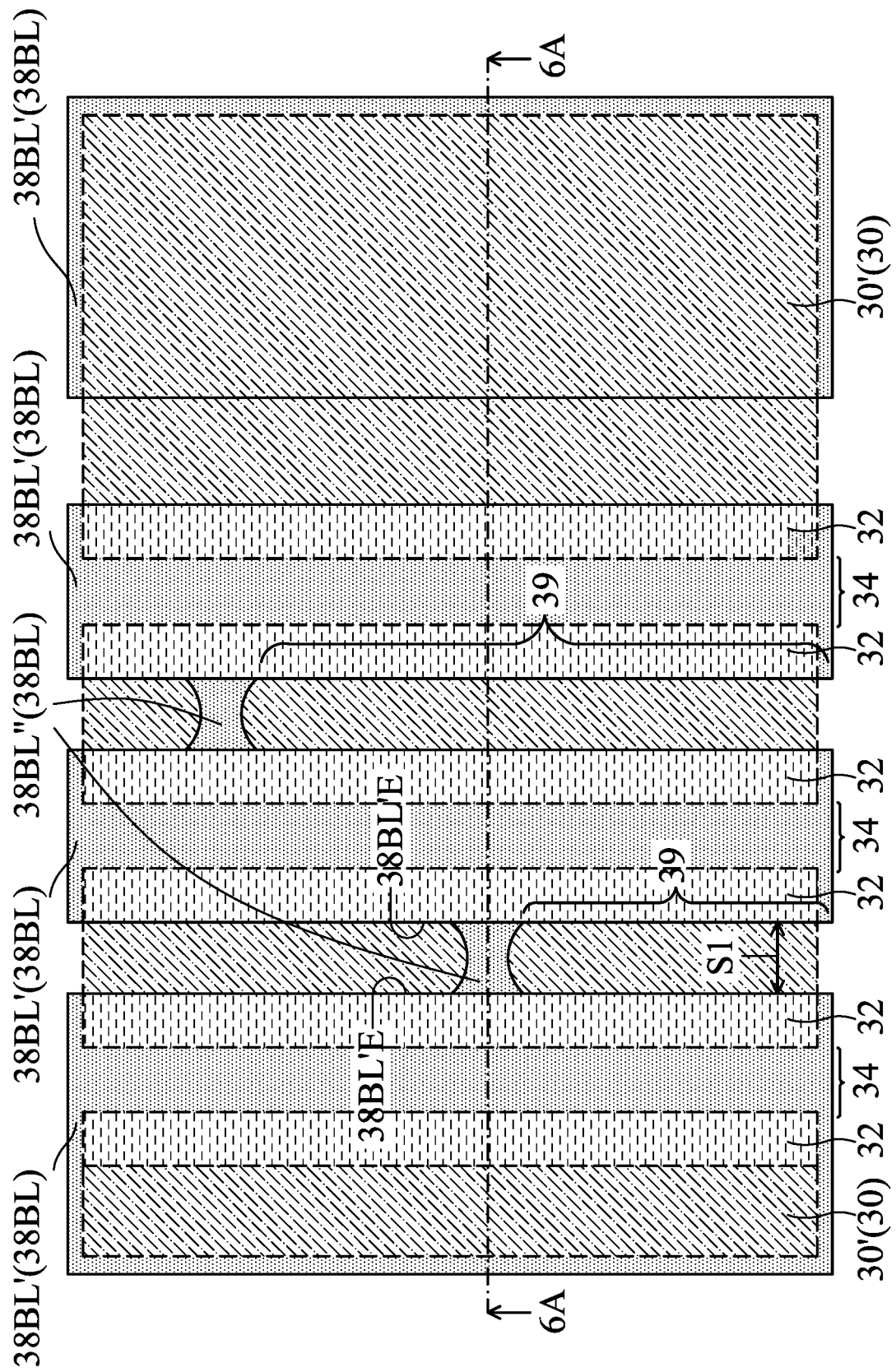

Next, middle layer 38ML is etched using the patterned top layer 38TL as an etching mask, so that the openings 39 extend into middle layer 38ML. After middle layer 38ML is etched-through, bottom layer 38BL is further patterned through etching, during which middle layer 38ML is used as an etching mask. During the patterning of bottom layer 38BL, top layer 38TL is consumed. Middle layer 38ML may be partially or fully consumed during the patterning of bottom layer 38BL. In the patterning of bottom layer 38BL, openings 39 extend downwardly, revealing some portions of mandrels 30. The resulting structure is shown in FIGS. 6A and 6B, wherein FIG. 6B illustrates a top view, and FIG. 6A illustrates the cross-section 6A-6A in FIG. 6B. The structure shown in FIG. 6B is essentially the same as shown in FIG. 5B, except that the patterns of top layer 38TL has been transferred to bottom layer 38BL. Accordingly, bottom layer 38BL includes (bulk) portions 38BL' (FIG. 6B), and bridge portions 38BL" interconnecting bulk portions 38BL'.

In accordance with some embodiments, as shown in FIG. 6A, the edges 38BL'E of some bottom layer bulk portions 38BL' may be vertically aligned to the interface between mandrels 30 and their neighboring spacers 32. It is appreciated that due to process variation, the edges of bottom layer 38BL may laterally shift slightly, for example, to overlap mandrels 30 or spacers 32 slightly.

Figure 7A:
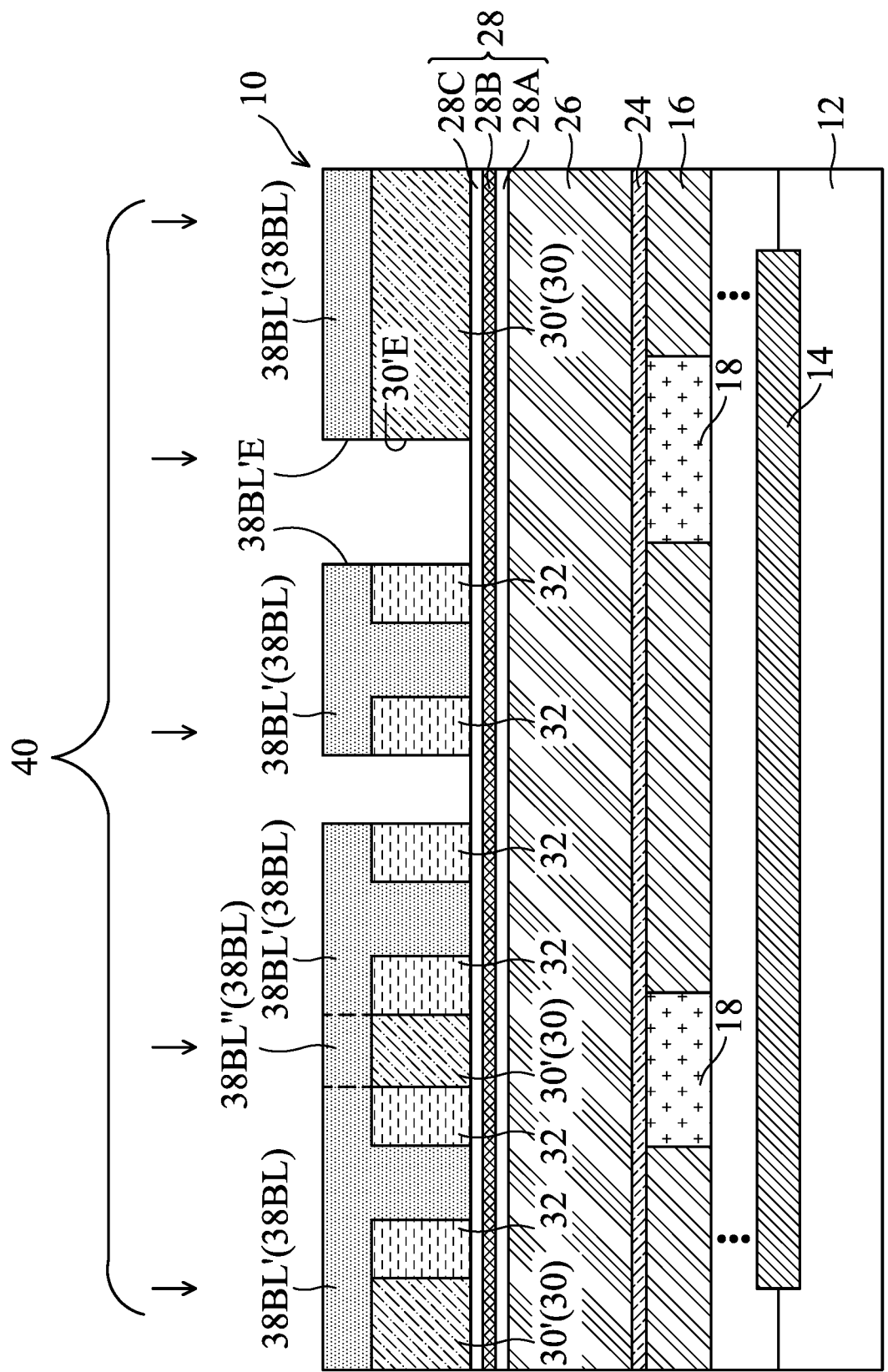
Figure 7B:
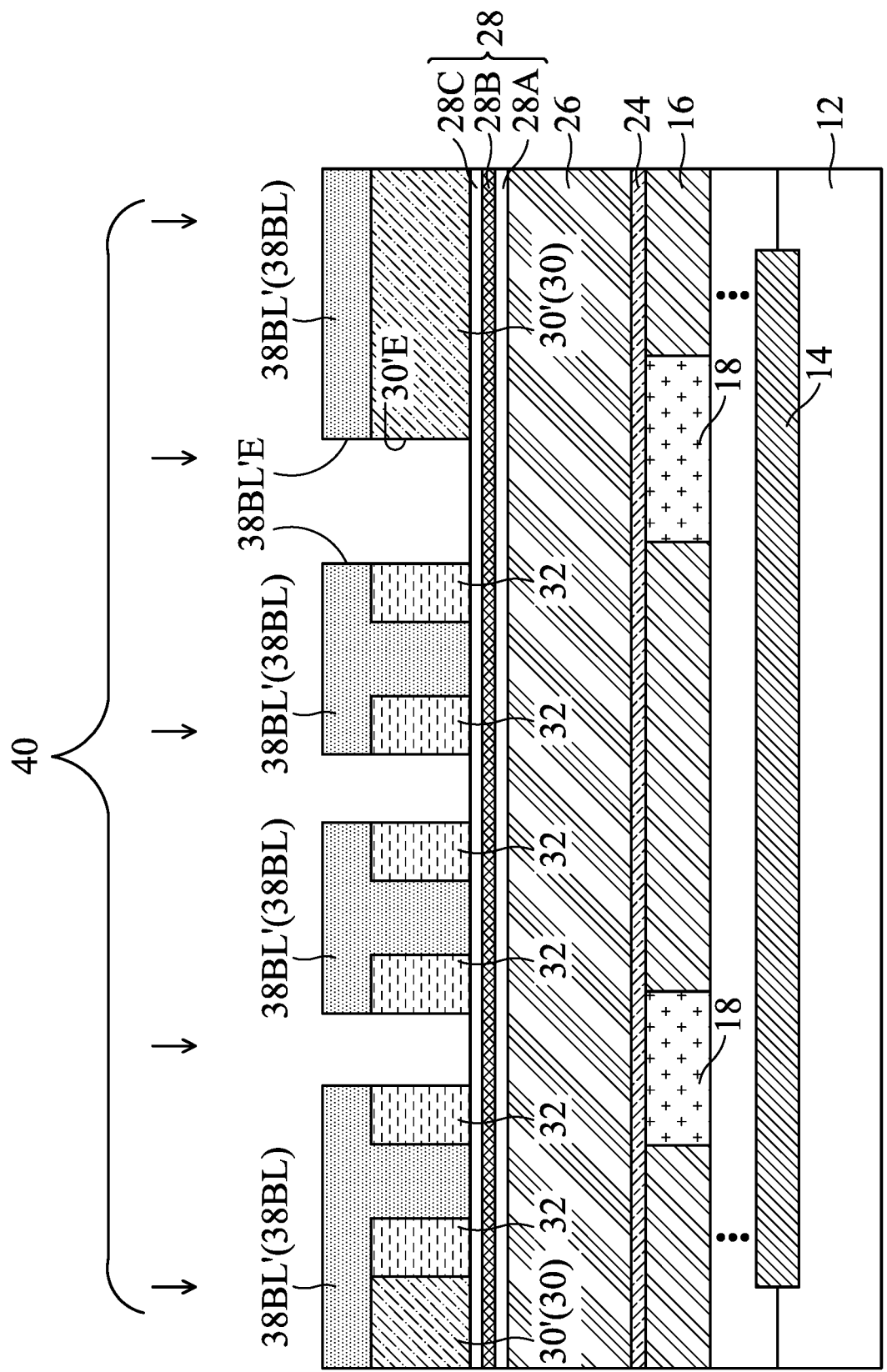
Figure 7C:
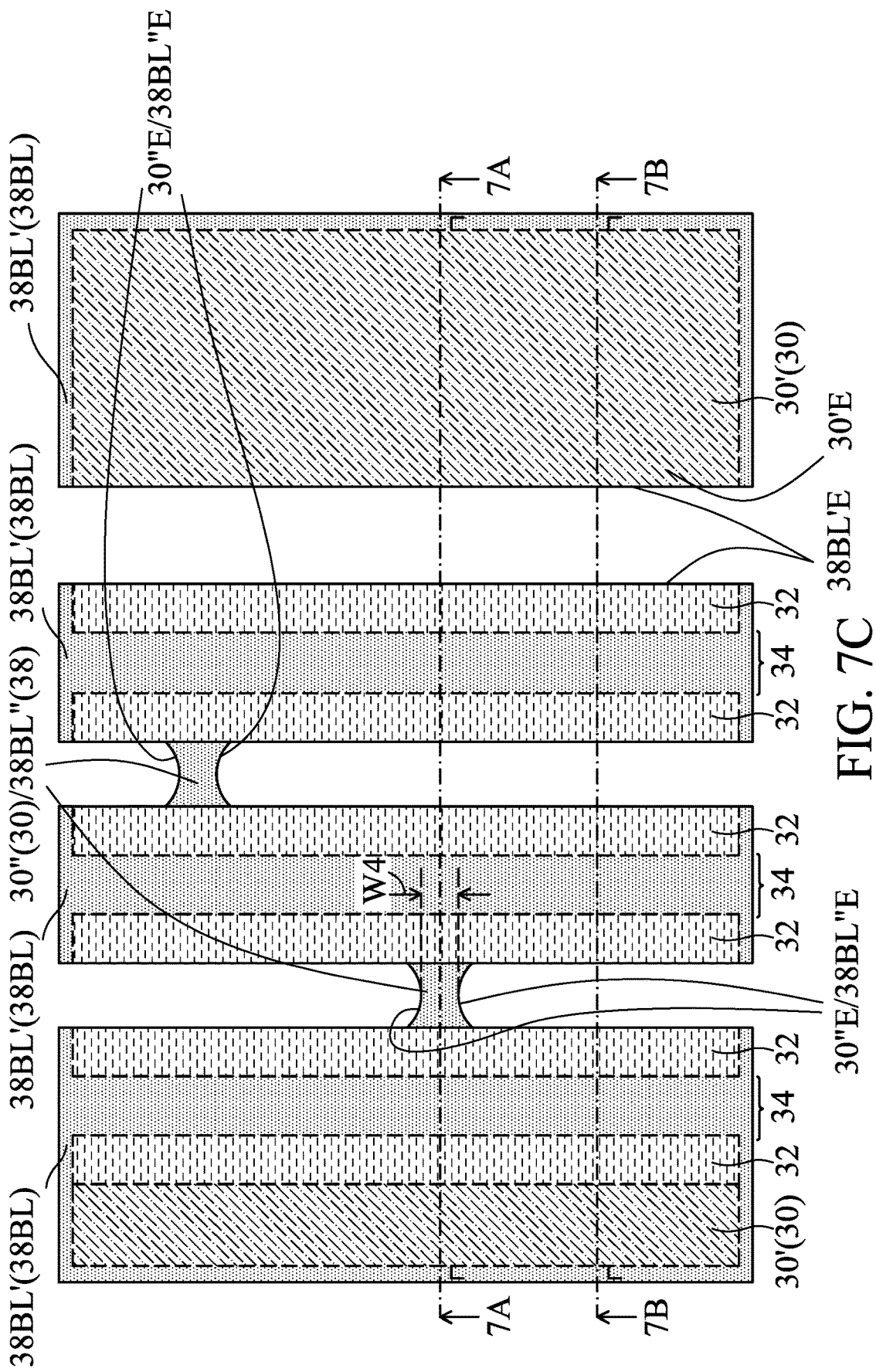

FIGS. 7A, 7B, and 7C illustrate a first etching process 40 to etch the exposed portions of mandrels 30. The respective process is illustrated as process 214 in the process flow 200 as shown in FIG. 15. FIG. 7C illustrates a top view, and FIGS. 7A and 7B illustrate the cross-sections 7A-7A and 7B-7B, respectively, in FIG. 7C. The exposed portions of mandrels 30 (FIG. 6B) are etched. The portions of mandrels 30 protected by the bulk portions 38BL' and bridge portions 38BL" remain after etching process 40, and the remaining portions are referred to as (mandrel) bulk portions 30' and (mandrel) bridge portions 30", respectively, as shown in FIGS. 7A, 7B, and 7C. The width of bridge portions 38BL" may be equal to width W4.

In accordance with some embodiments, etching process 40 is an anisotropic etching process. In accordance with some embodiments, the DC bias voltage is selected to be high enough, for example, higher than about 100 Volts, to achieve the anisotropic etching. The etching gas is also selected, so that an etching selectivity ER30/ER32, which is the ratio of the etching rate ER30 of mandrel portions 30'/30" to the etching rate ER32 of spacers 32, is high. ER30/ER32 may be as high as possible to achieve accurate process control. For example, ER30/ER32 is higher than about 5, and may be higher than about 10, higher than about 20, higher than 50, or higher. In accordance with some embodiments, for example, when mandrel portions 30'/30" comprise amorphous silicon, and spacers 32 comprise titanium nitride, the etching gas may include $Cl_2$, HBr, $N_2$, and/or the like, and combinations thereof. It is appreciated that the etching gas is related to the combination of the materials of mandrel portions 30'/30" and spacers 32, and when different combinations are used, different etching gases may be adopted.

The first etching process 40 is finished when mandrel portions 30'/30" are etched-through, which may be determined by detecting the signal of the material of mask layer 28C. After the first etching process 40, the edges 30'E of mandrel bulk portions 30' are vertically aligned to the edges 38BL'E of the bulk portions 38BL', and the edges 30"E (FIG. 7C) of mandrel bridge portions 30" are vertically aligned to the edges 38BL"E of the bottom layer bridge portions 38BL".

Figure 8A:
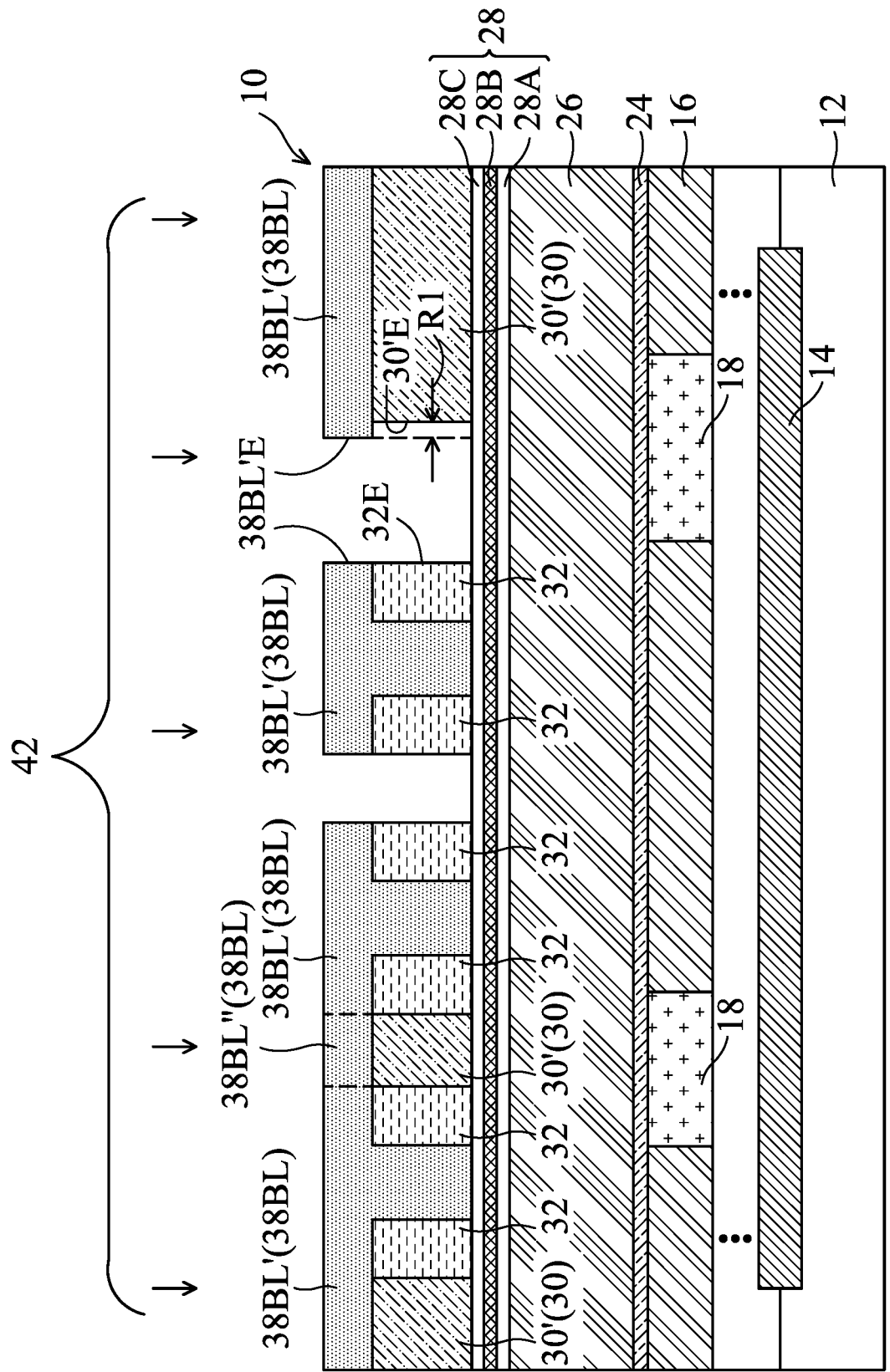
Figure 8B:
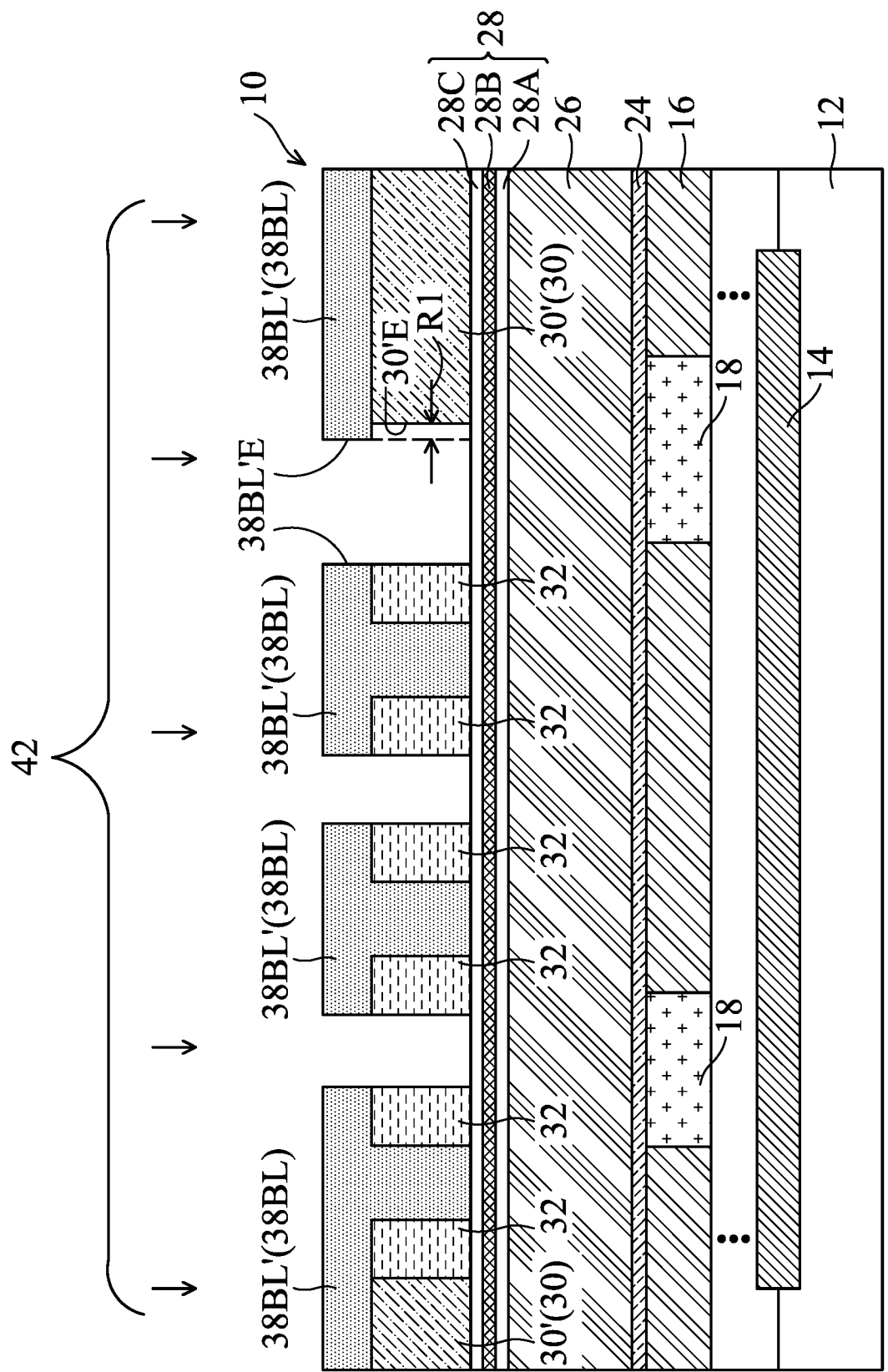
Figure 8C:
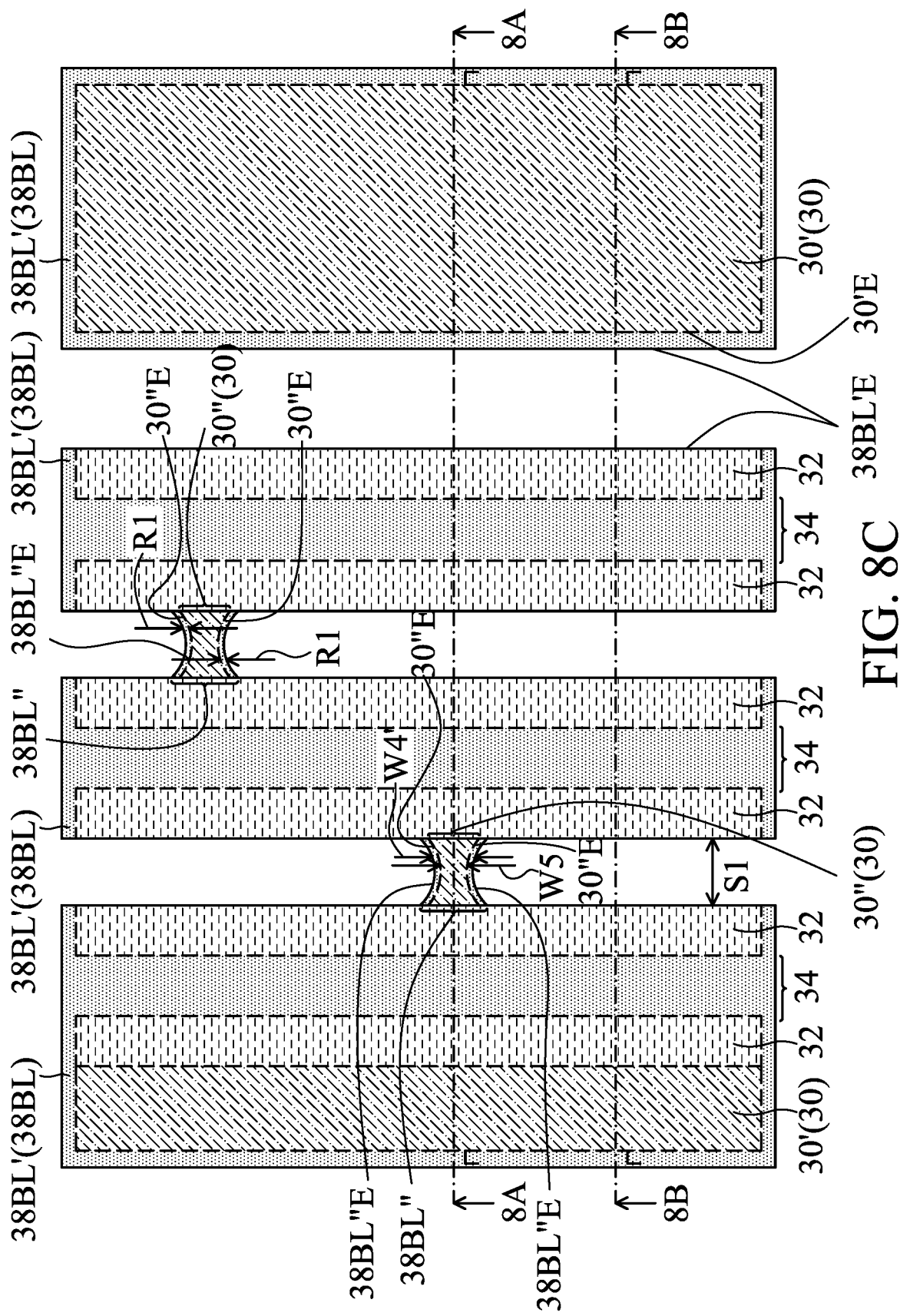
Figure 8D:
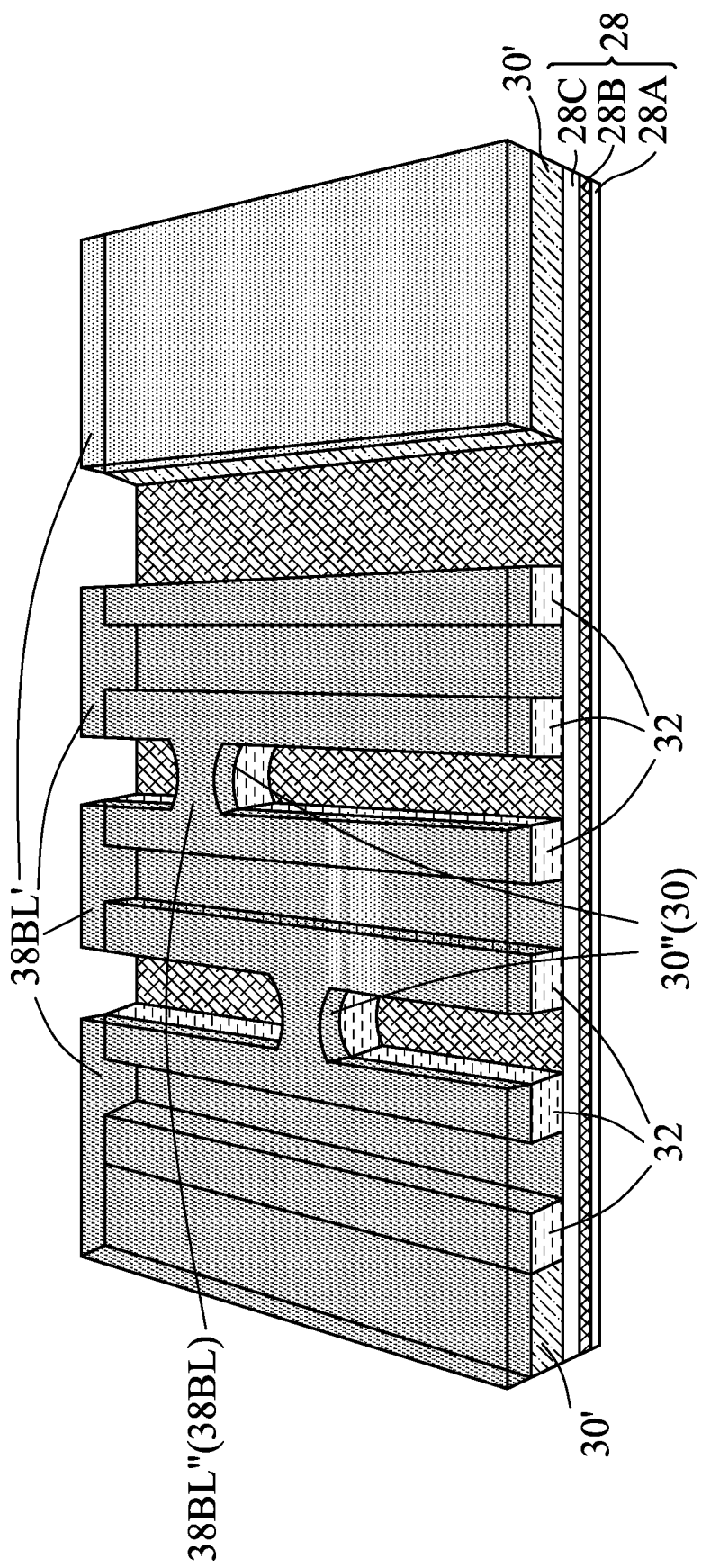

FIGS. 8A, 8B, 8C, and 8D illustrate a second etching process 42 to laterally recess mandrel portions 30". The respective process is illustrated as process 216 in the process flow 200 as shown in FIG. 15. FIG. 8D illustrates a perspective view of some layers. FIG. 8C illustrates a top view, and FIGS. 8A and 8B illustrate the cross-sections 8A-8A and 8B-8B, respectively, in FIG. 8C. The second etching process 42 is performed using a process gas(es) that may etch mandrel portions 30'/30", and does not etch spacers 32 and mask layer 28C. Accordingly, the etching process 42 is stopped on mask layer 28. For example, the etching gas is selected, so that the etching selectivity ER30/ ER32 is high. ER30/ER32 may be as high as possible to achieve accurate process control. For example, ER30/ER32 is higher than about 5, and may be higher than about 10, higher than about 20, higher than about 50, or higher. In accordance with some embodiments, for example, when mandrel portions 30'/30" comprise amorphous silicon, and spacers 32 comprise titanium nitride, the etching gas may include $Cl_2$, $CH_4$, $NF_3$, and/or the like, and combinations thereof.

In accordance with some embodiments, the second etching process 42 is performed using the same process conditions (including the same etching gases and the same parameters such as the same gas flow rate, the same bias power, the same partial pressure, etc.). Accordingly, the etching is anisotropic. Since the etching is stopped on mask layer 28C, although the etching is anisotropic, there may be lateral (isotropic) etching effect. As aforementioned, since the etching gases are selected so that the etching selectivity ER30/ER32 is high, spacers 32 are not etched or substantially not etched laterally in the second etching process 42. On the other hand, the mandrel portions 30'/30" are etched laterally.

For example, FIG. 8A illustrates that mandrel portions 30' is laterally recessed from the respective edge 38BL'E by lateral recessing distance R1. In accordance with some embodiments, the duration of the second etching process 42 is selected, so that the lateral recessing distance R1 is greater than about 0.5 nm, and may be greater than about 1 nm, or greater than about 2 nm. The lateral recessing distance R1 may be in the range between about 1 nm and about 5 nm. On the other hand, also due to the high etching selectivity, the spacers 32 are substantially not laterally recessed. For example, the lateral recessing distance of spacers 32 from the respective edge 38BL'E may be smaller than about ⅕ of recessing distance R1, smaller than about ⅒, ½₀, or ½₀ of the recessing distance R1, or ever smaller, and may be smaller than about 0.5 nm, smaller than about 0.2 nm, or smaller than about 0.1 nm. The corresponding edges 32E may thus be vertically aligned to, or may extend laterally beyond the respective edge 38BL'E slightly.

In accordance with some embodiments in which the second etching process 42 adopt the same process conditions as etching process 40, the duration T42 of the second etching process 42 may be equal to or greater than the duration T40 of etching process 40, so that the lateral recessing distance R1 is high enough. For example, the ratio T42/T40 may be greater than 1 or greater than about 1.5, and may be in the range between about 1 and about 2.0, and may be in the range between about 1.5 and about 2.0.

FIG. 8C illustrates that mandrel bridging portions 30" also have their edges 30"E laterally recessed from the respective edge 38BL"E of bottom layer 38BL, for example, by lateral recessing distance R1. Accordingly, the width W5 of mandrel portions 30" are reduced to be smaller than the width W4' of bottom layer portions 38BL" by difference equal to 2R1. In accordance with some embodiments, width W4' is the minimum width that can be achieved by the corresponding formation technology, and may be equal to or slightly smaller than width W4 (FIG. 7C). For example, with 193 nm wavelength being used for light-exposure, the width W4' may be in the range between about 22 nm and about 24 nm, and width W5 may be reduced to be in the range between about 18 nm and about 20 nm. Ratio W5/W4 may be in the range between about 60 percent and about 90 percent.

On the other hand, due to the high etching selectivity ER30/ER32, the lateral spacing S1 (as marked in FIG. 8C) between neighboring spacers 32 is the same or substantially the same as the spacing S1 in FIG. 6B. For example, the increase (if any) in spacing S1 in FIG. 8C over the spacing S1 in FIG. 6 is smaller than about 0.5 nm, smaller than about 0.2 nm, or smaller than about 0.1 nm.

In accordance with alternative embodiments, the second etching process 42 is performed using different process conditions than first etching process 40. The different process conditions may include different etching gases and/or different etching parameters such as different etching gas flow rates, different bias powers, different partial pressures of the gases, etc. In accordance with some embodiments, the second etching process 42 is performed using a lower bias power than the first etching process 40. For example, the bias power of the second etching process 42 may be lower than about 80 percent, and may be in the range between about 20 percent and about 80 percent, of the bias power used for the first etching process 40. Reducing the bias power may reduce the anisotropic effect and increase the isotropic etching effect, so that the lateral recessing of mandrel portions 30" is increased. Other process conditions such as the chamber pressure, the etching gas flow rate, etc., may also be adjusted to increase the isotropic effect for the second etching process 42. For example, the flow rate and/or the chamber pressure during the second etching process 42 may be increased higher than in the first etching process 40.

In accordance with yet alternative embodiments, the second etching process 42 includes a first part being anisotropic, and a second part being more isotropic than the first part. The second part may be partially or fully isotropic.

In accordance with alternative embodiments, the first etching process 40 and second etching process 42 may adopt different process gases. For example, in the first etching process 40, due to the anisotropic effect, the corresponding etching selectivity ER30/ER32 may have a first value V1, which is not very high, for example, in the range between about 2 and about 5. Due to the anisotropic etching behavior (such as high bias power) and due to the protection of bottom layer 38BL on spacers 32, spacers 32 are not etched and there is no anisotropic etching of spacers 32. In the second etching process 42, process gases are changed, so that the corresponding etching selectivity ER30'/ER32' is increased to second value V2, which is higher than first etching selectivity value V1. The ratio V2/V1 may be greater than about 1.2, and may be in the range between about 1.2 and about 5, for example.

In accordance with yet alternative embodiments, the using of different etching gases in etching processes 40 and 42 is combined with the adjustment of process parameters to achieve the lateral etching of mandrel portions 30'/30", without laterally etching spacers 32.

In accordance with yet alternative embodiments, the second etching process 42 includes a first sub process and a second sub process following the first sub process. The first sub process may adopt the same process condition as the first etching process 40, and the second sub process may adopt a different process condition than the first etching process 40, wherein the different process conditions are as aforementioned. In accordance with yet alternative embodiments, the process conditions may be gradually transitioned from the process conditions of the first etching process 40 to the process conditions of the second etching process 42. For example, the bias power may be gradually reduced.

The subsequent FIGS. 9A, 9B, and 9C through FIGS. 13A, 13B, and 13C illustrate the formation of dual damascene structures using the masks formed in preceding processes. The illustrated process is a via-first process, in which the patterns of vias are formed before the formation of trenches. It is appreciated that the illustrated processes are one of the example available processes, while other processes are also in the scope of the present application.

Figure 9A:
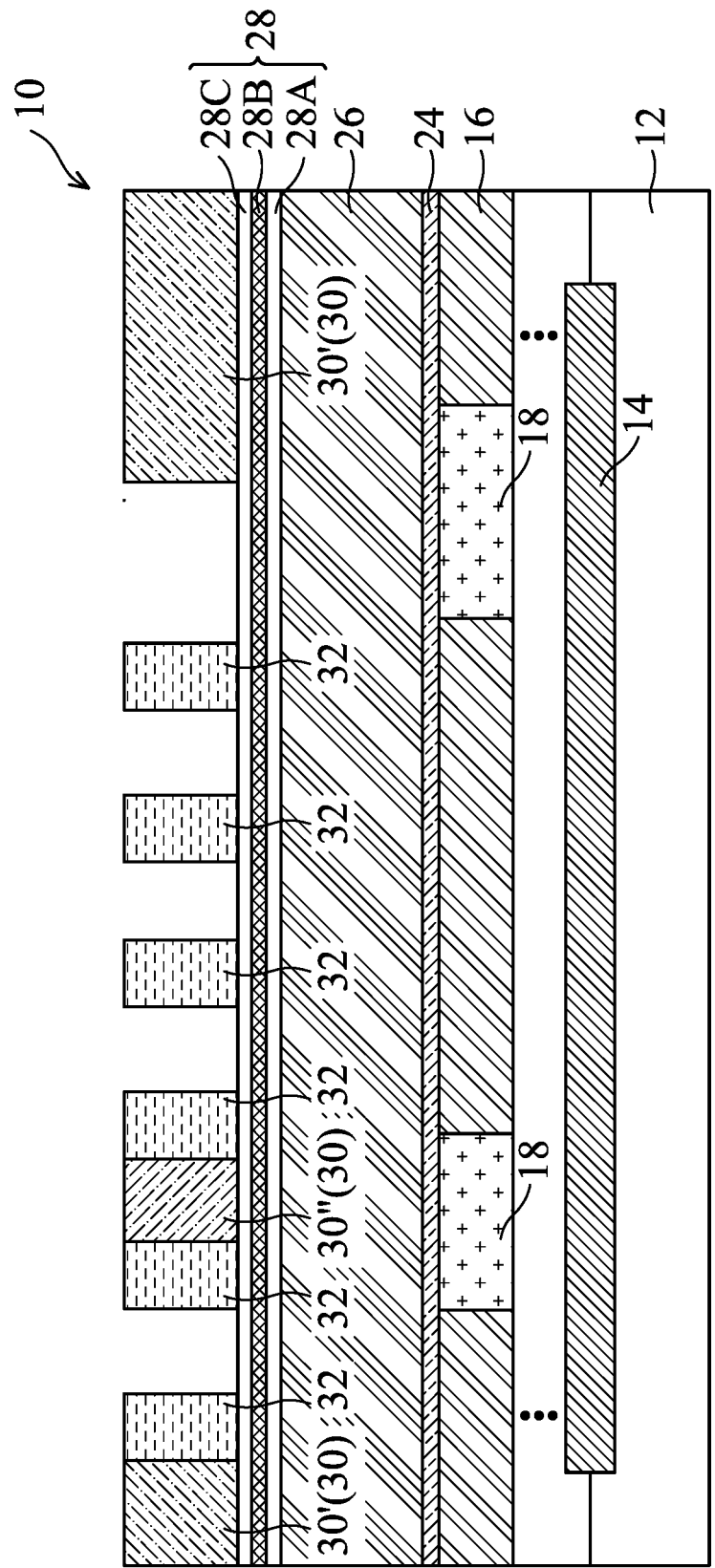
Figure 9B:
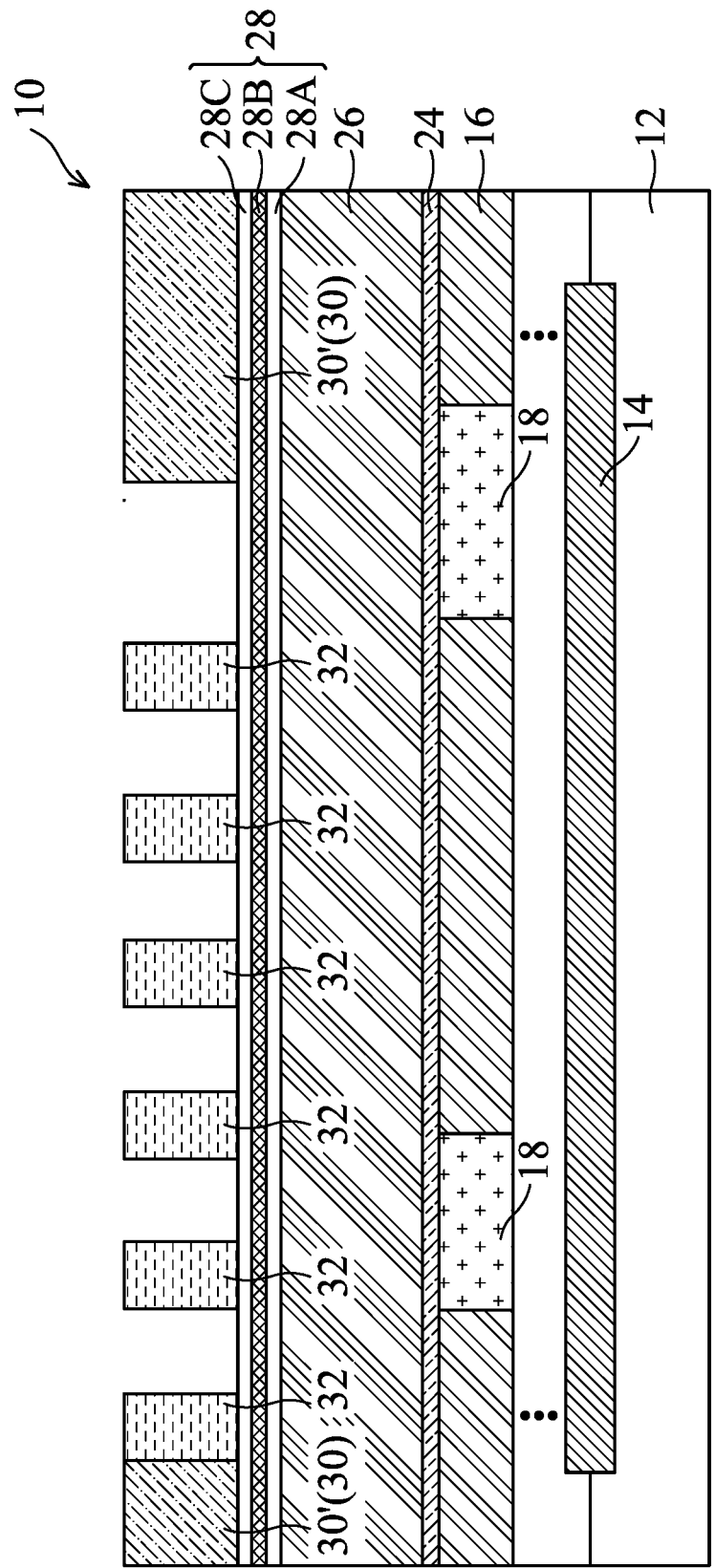
Figure 9C:
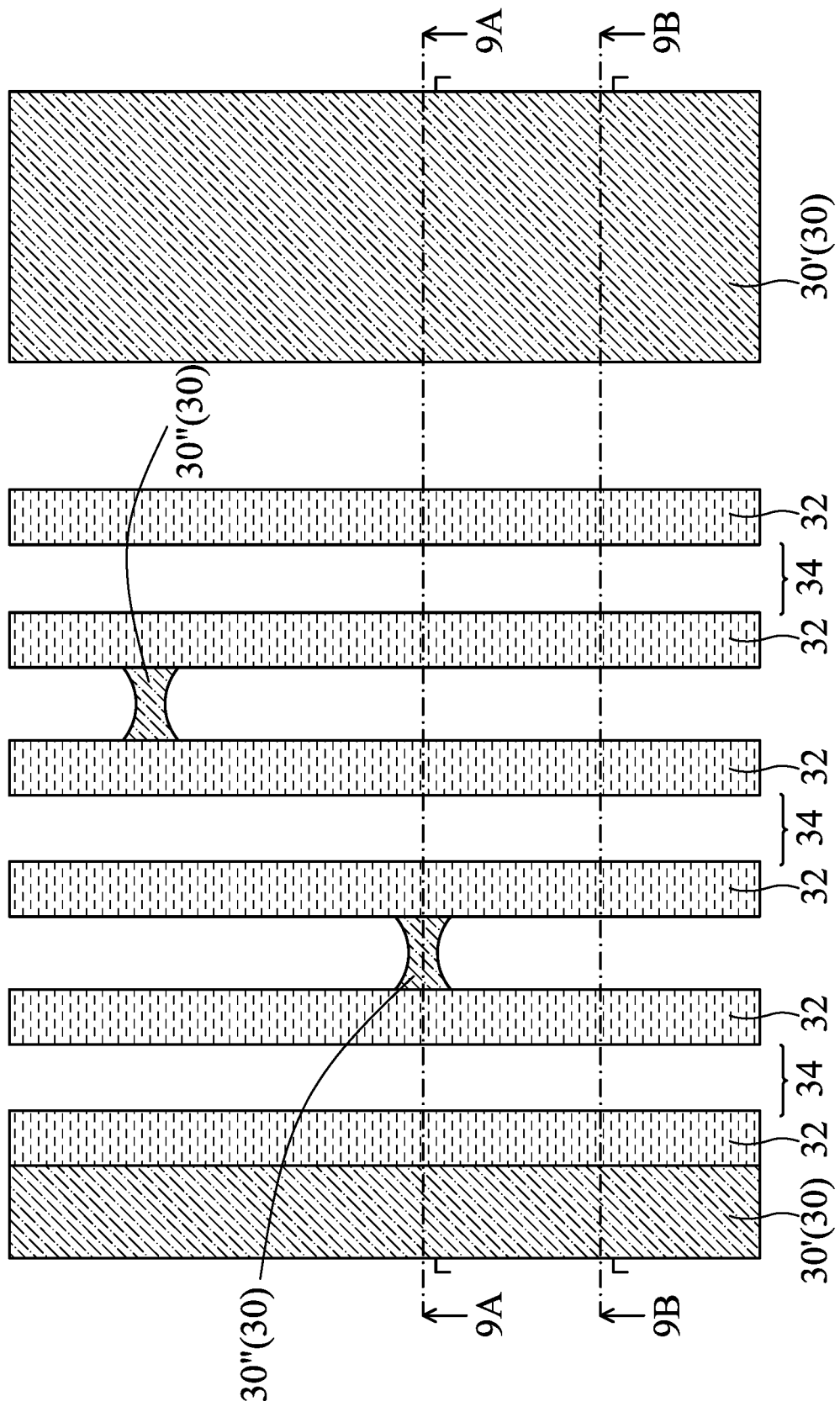
Figure 10A:
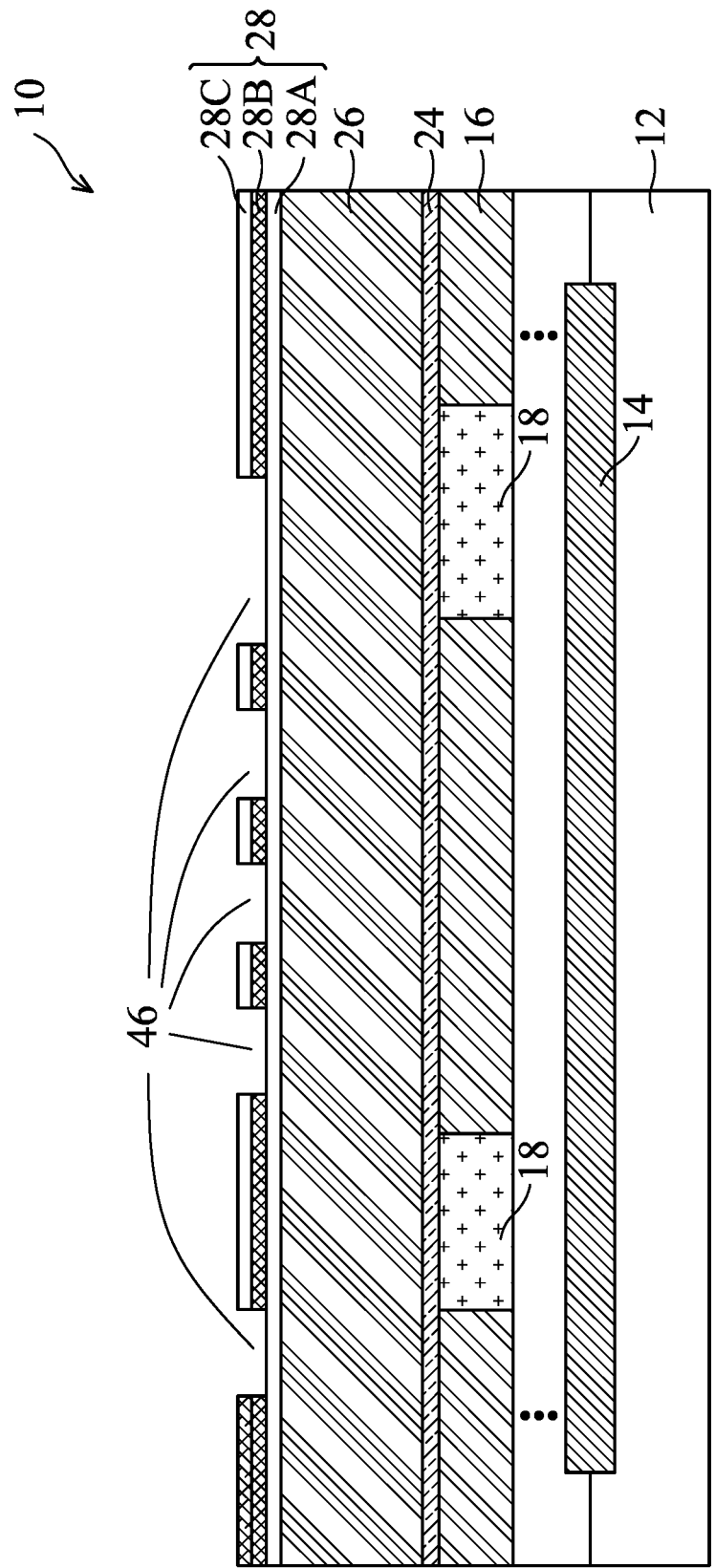
Figure 10B:
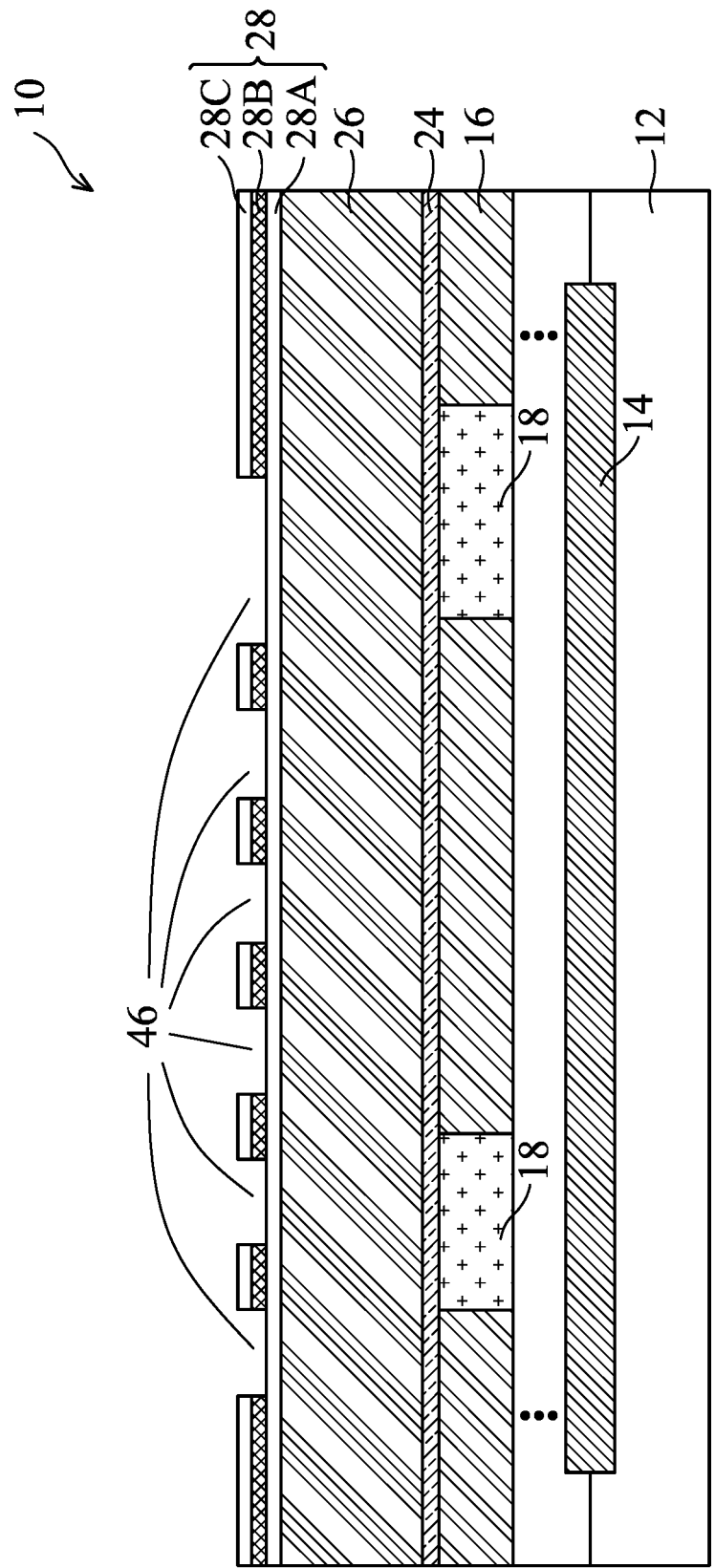
Figure 10C:
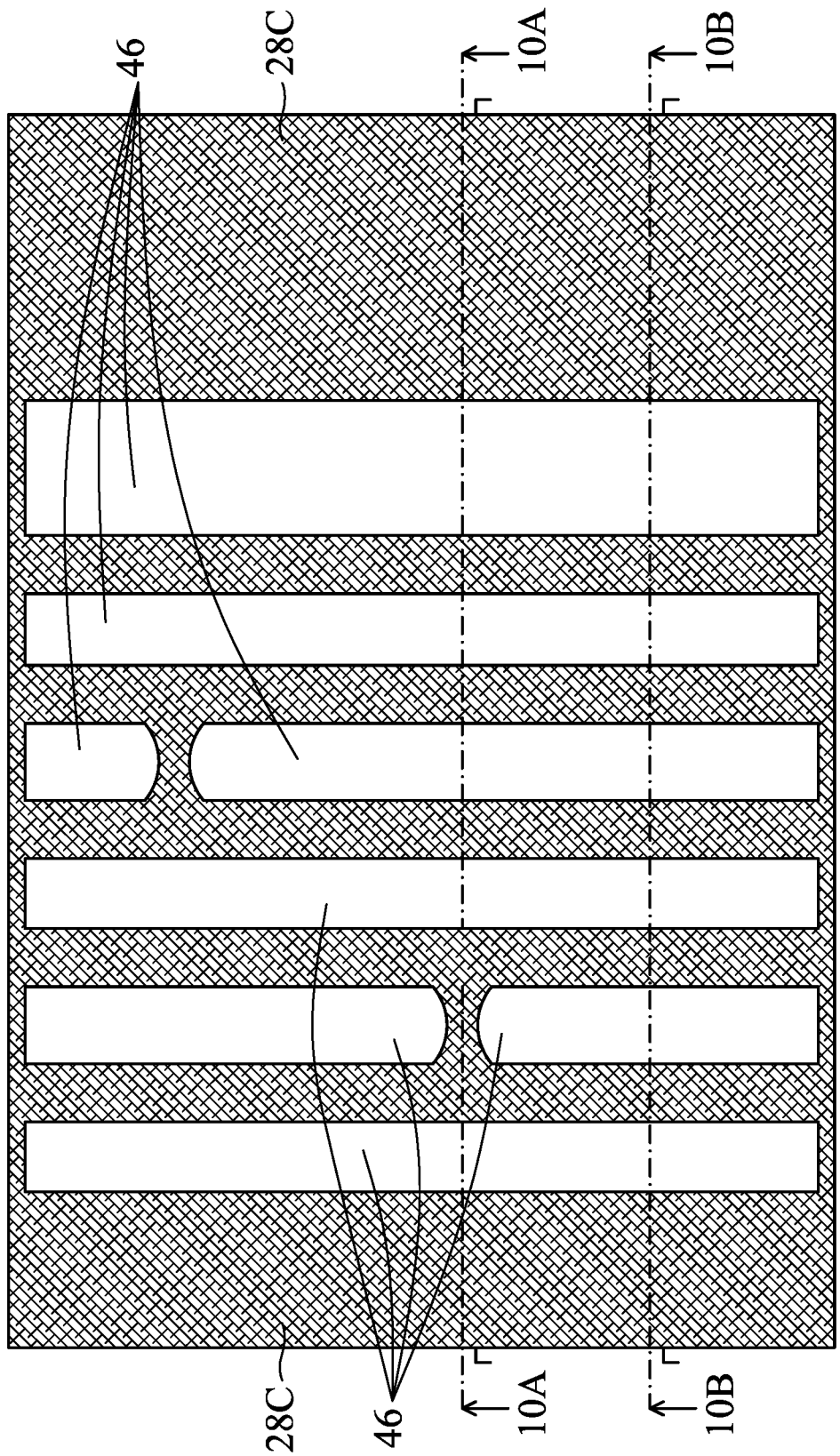

In accordance with some embodiments, bottom layer 38BL is removed, and the resulting structure is shown in FIGS. 9A, 9B, and 9C, which structure is used for forming the trenches as shown in FIGS. 10A, 10B, and 10C. In accordance with alternative embodiments, the structure shown in FIGS. 8A, 8B, and 8C are used directly (without removing bottom layer 38BL first) to form the trenches as shown in FIGS. 10A, 10B, and 10C, wherein bottom layer 38BL are consumed during the formation of the trenches.

An etching process(es) is performed on the structure shown in FIGS. 8A, 8B, 8C, and 8D (or the structure shown in FIGS. 9A, 9B, and 9C) to etch-through mask layer 28C and mask layer 28B. Accordingly, trenches 46 are formed in hard mask 28 and penetrating through metal hard mask layers 28C and 28B, as shown in FIGS. 10A, 10B, and 10C. The respective process is illustrated as process 218 in the process flow 200 as shown in FIG. 15. Trenches 46 define the patterns of the subsequently formed metal lines. Mask layer 28A is thus exposed. Trenches 46 may be stopped on mask layer 28A, and mask layer 28A is used as the etch stop layer. Mask layer 28C and mask layer 28B may be etched using different etching chemicals, and each may be etched using an anisotropic etching process (a dry etching process) or an isotropic etching process. For example, mask layer 28C may be etched using the mixture of $NF_3$ and $NH_3$ gases or the mixture of HF and $NH_3$ gases when dry etching is used, or an HF solution when wet etching is used. Mask layer 28B may be etched using gases comprising $BCl_3$, $Cl_2$, $CF_4$, $CHF_3$, $NF_3$, $O_2$, Ar, etc. or combinations thereof when dry etching is used, or a phosphoric acid solution when wet etching is used.

When the etching of mask layer 28B is finished, spacers 32 and mandrel portions 30' and 30" may be fully consumed in accordance with some embodiments. In accordance with alternative embodiments, there are some mandrel portions 30' and 30" and spacers 32 remaining after mask layers 28C and 28B are etched-through, and these features may be removed in a separate process, for example, through a wet etching process(es).

Figure 11A:
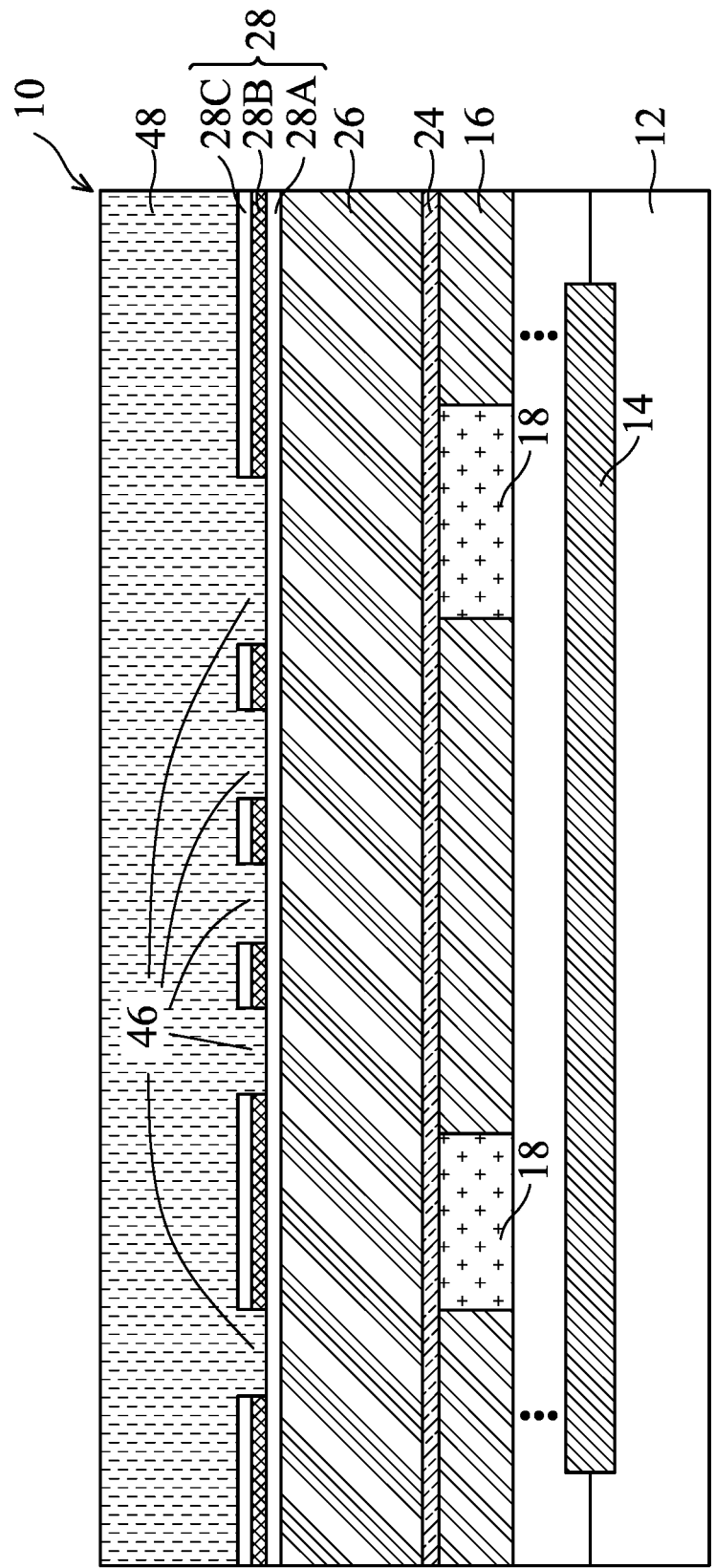
Figure 11B:
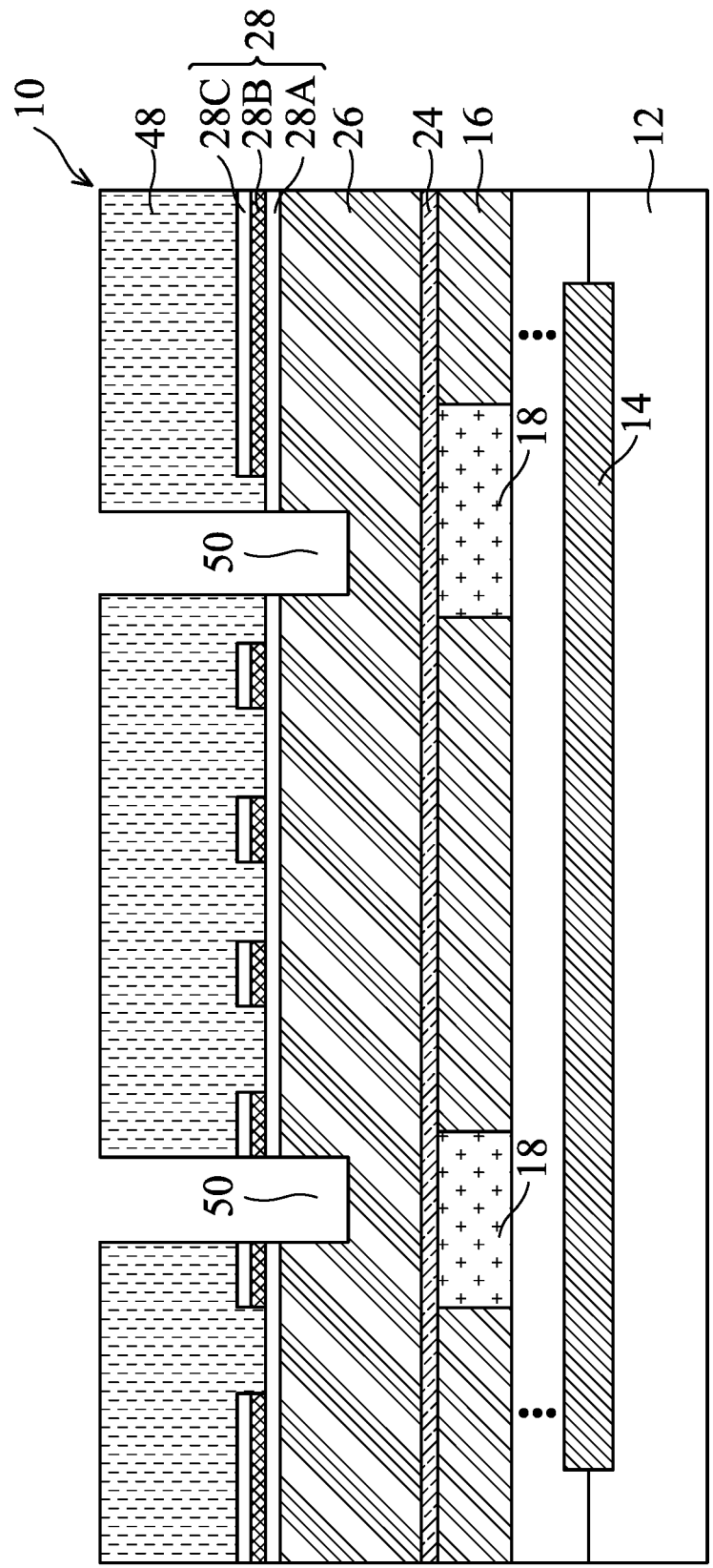

FIGS. 11A and 11B illustrate the cross-sectional views in the formation of via openings 50. The respective process is illustrated as process 220 in the process flow 200 as shown in FIG. 15. FIGS. 11A and 11B illustrate cross-sectional views obtained from the cross-sections same as the cross-sections 10A-10A and 10B-10B, respectively, in FIG. 10C. Etching mask 48, which may be a single-layer etching mask, a double layer etching mask, or a tri-layer etching mask, is formed and patterned. Mask layer 28A is etched-through using etching mask 48 to define patterns. Next, dielectric layer 26 is etched, so that via openings 50 are formed in dielectric layer 26. In accordance with some embodiments, the etching of dielectric layer 26 is performed using an etching gas selected from $C_4F_6$, $C_4F_5$, $C_5F_8$, $CF_4$, $CHF_3$, $CH_2F_2$, $NF_3$, $N_2$, $O_2$, Ar, He, and combinations thereof. The etching is stopped at an intermediate level between the top surface and the bottom surface of dielectric layer 26. Via openings 50 may be formed using a single-patterning process or a double-patterning process. The bottoms of via opening 50 is at an intermediate level between the top surface and the bottom surface of dielectric layer 26. After the etching process, etching mask 48 is removed.

Figure 12A:
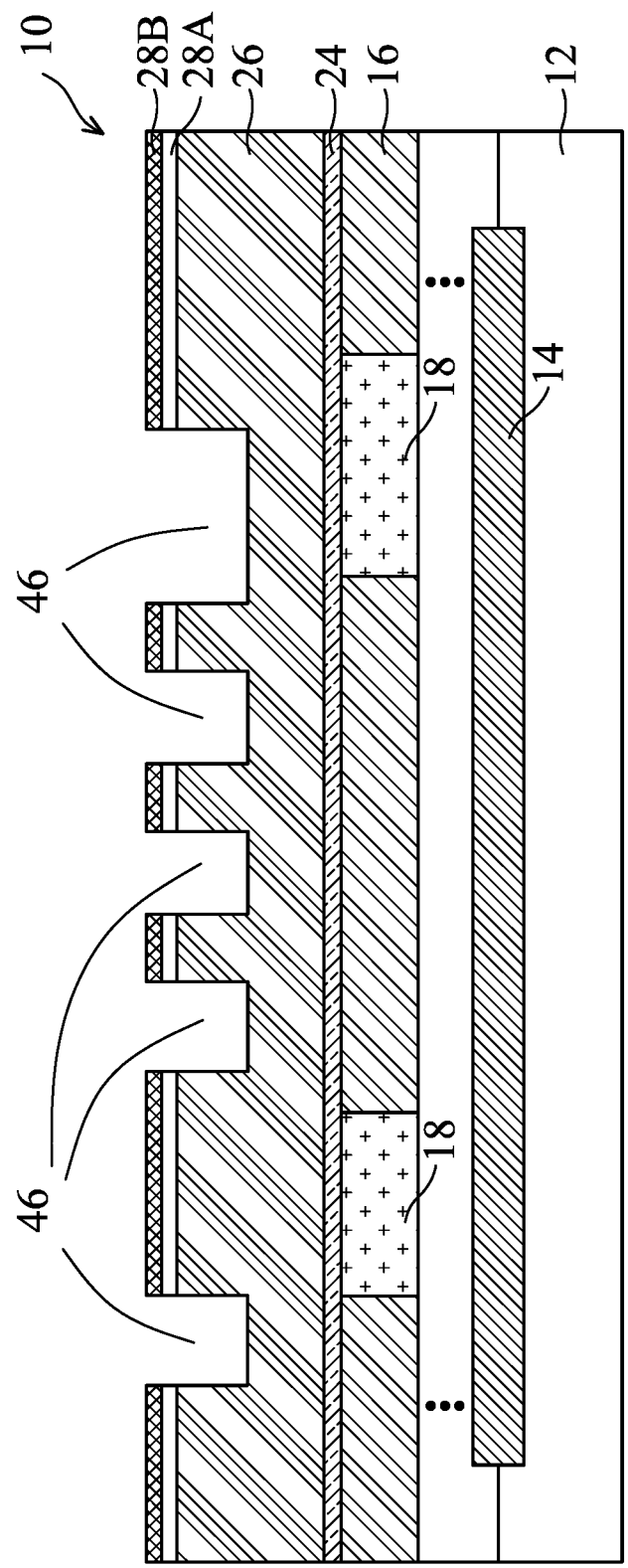
Figure 12B:
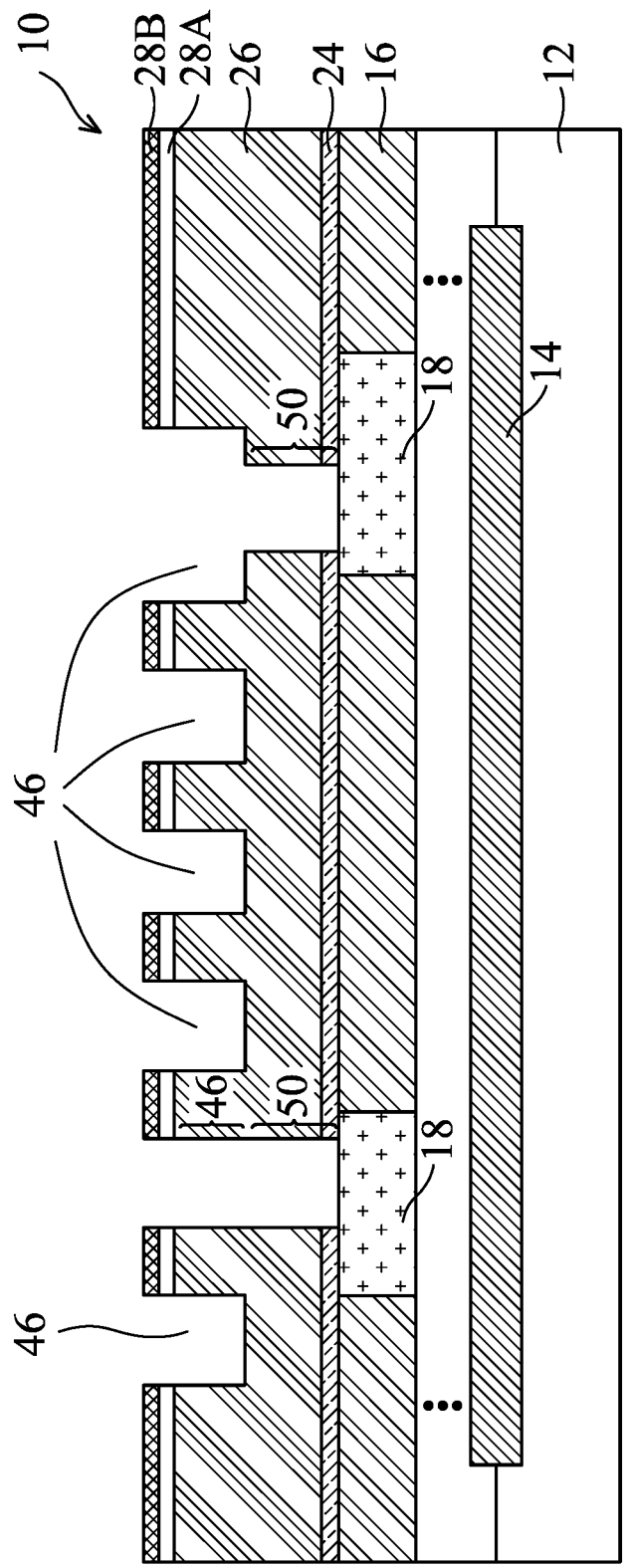

In a subsequent process, dielectric layer 26 is etched to transfer trench patterns into dielectric layer 26, wherein mask layer 28B is used as an etching mask. The respective process is illustrated as process 222 in the process flow 200 as shown in FIG. 15. In the etching process, mask layer 28A is etched-through, exposing the underlying dielectric layer 26. In accordance with some embodiments, mask layer 28C is consumed during the etching of mask layer 28A. Next, dielectric layer 26 is etched in an anisotropic etching process, so that trenches 46 extend into dielectric layer 26. The resulting structure is shown in FIGS. 12A and 12B. In the meanwhile, via openings 50 extend down to the bottom of dielectric layer 26. In accordance with some embodiments, the etching of dielectric layer 26 is performed using an etching gas selected from $C_4F_6$, $C_4F_5$, $C_5F_8$, $CF_4$, $CHF_3$, $CH_2F_2$, $NF_3$, $N_2$, $O_2$, Ar, He, and combinations thereof. In accordance with some embodiments, trenches 46 extend to an intermediate level between the top surface and the bottom surface of dielectric layer 26, and the intermediate level may be in the middle between the top surface and the bottom surface of dielectric layer 26. Next, an etching process(es) is performed to etch-through etch stop layer 24 and to reveal conductive features 18.

Figure 13A:
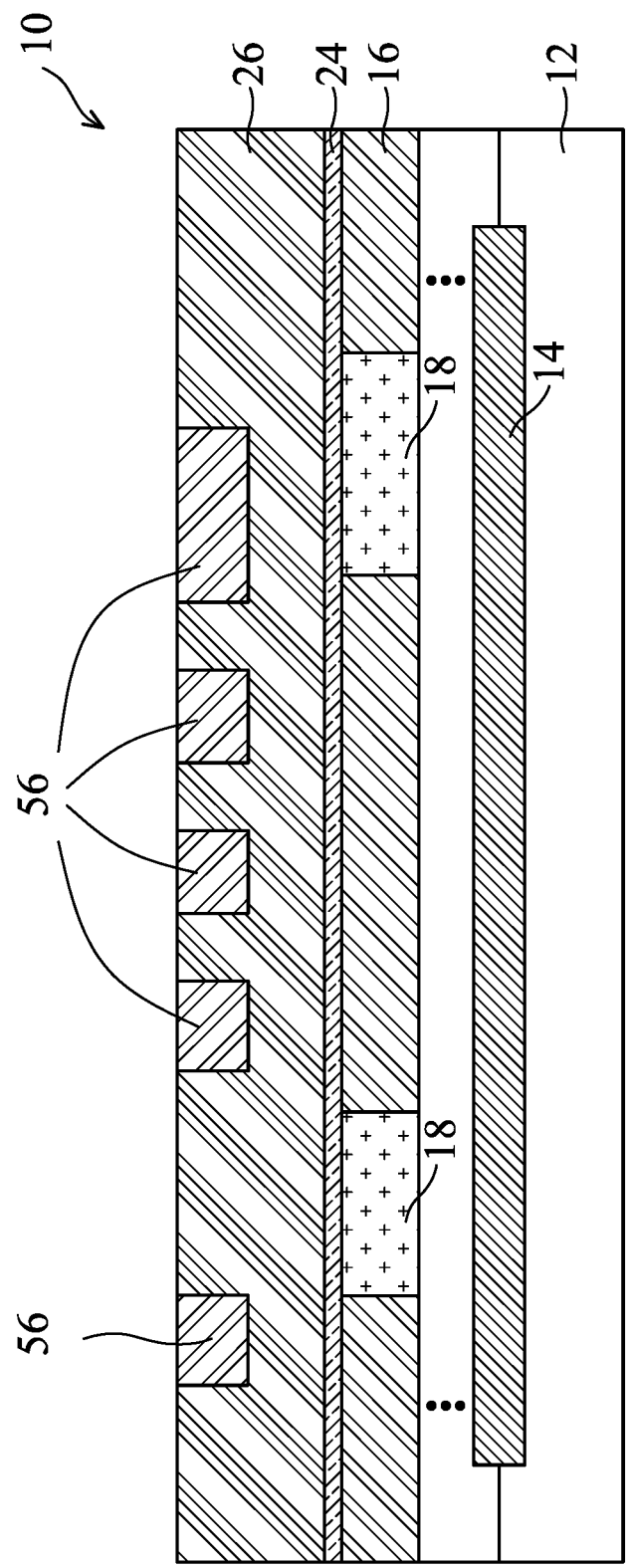
Figure 13B:
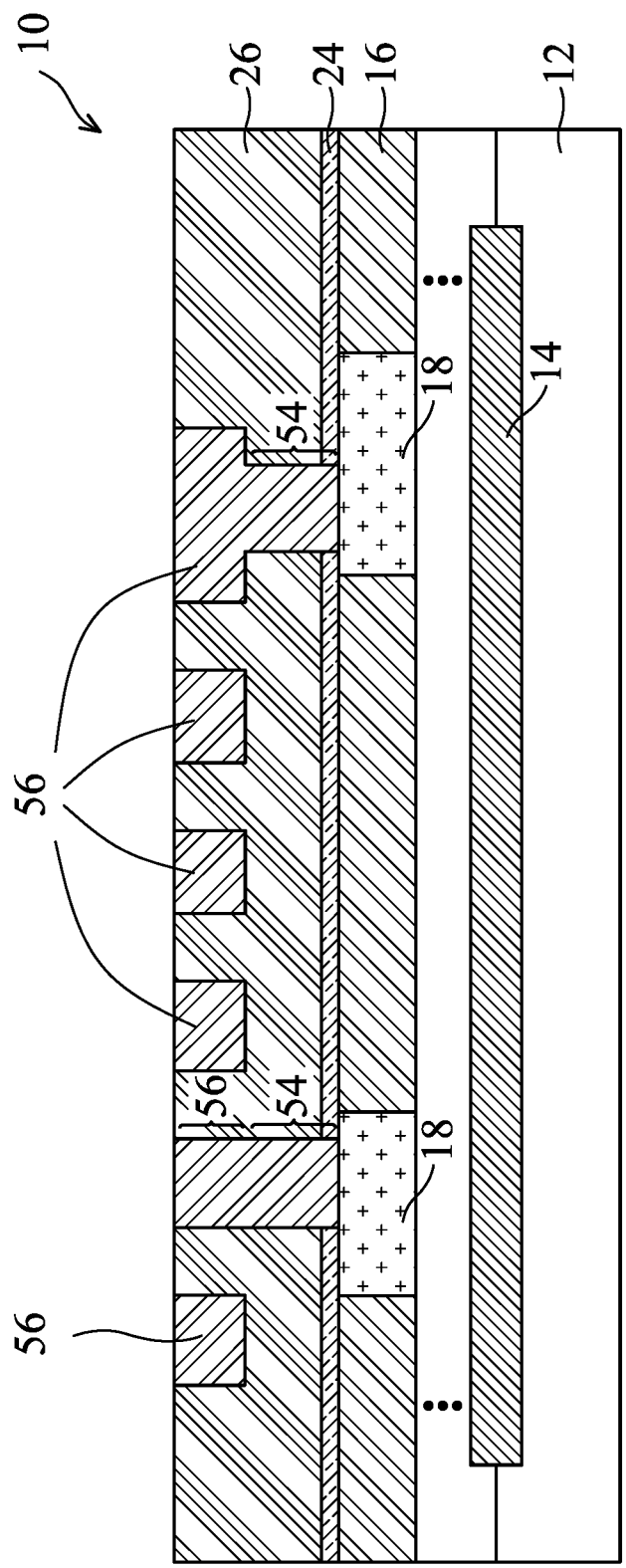
Figure 13C:
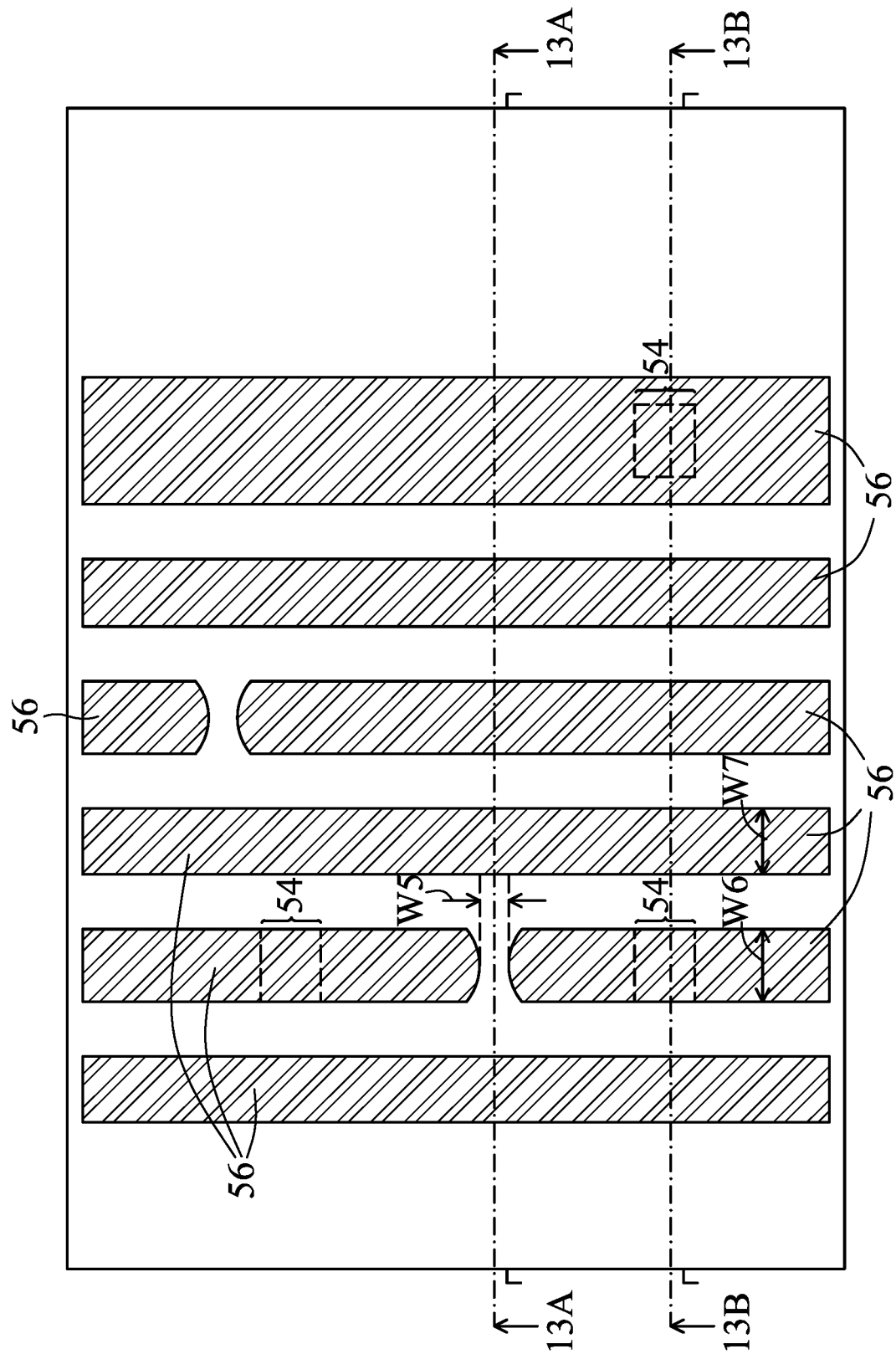

FIGS. 13A, 13B, and 13C illustrate the formation of metal lines and vias. The respective process is illustrated as process 224 in the process flow 200 as shown in FIG. 15. FIG. 13C illustrates a top view, and FIGS. 13A and 13B illustrate cross-sectional views obtained from cross-sections 13A-13A and 13B-13B, respectively, in FIG. 13C. In accordance with some embodiments, a metallic material such as cobalt, tungsten, or the like, or combinations thereof, is filled into via openings 50 and trenches 46. The metallic material may be deposited using a barrier-less process, wherein no barrier is formed, and the metallic material is in physical contact with conductive features 18 and dielectric layer 26. In accordance with alternative embodiments, the conductive material may include a diffusion barrier layer and a metallic material on the diffusion barrier layer. The diffusion barrier layer may be formed of titanium, titanium nitride, tantalum, tantalum nitride, or the like. The metallic material may be formed of or comprise copper, tungsten, or the like.

In a subsequent process, a planarization process such as a Chemical Mechanical Polish (CMP) process or a mechanical polishing process is performed to remove excess portions of the conductive material. In accordance with some embodiments, dielectric layer 26 is used as a CMP stop layer. In accordance with alternative embodiments, mask layer 28A or 28B is used as a CMP stop layer, and after he planarization process, mask layers 28B and 28A are etched in a subsequent process. Vias 54 and metal lines 56 are formed, which in combination form dual damascene processes.

Referring to FIG. 13C, metal lines 56A and 56B have end-to-end spacing (also referred to as line-end spacing) W5. Due to the lateral recessing of mandrel portions 30" as discussed referring to FIGS. 8A, 8B, and 8C, the line-end spacing W5 is small. The line-end spacing W5 may be reduced to be smaller than the minimum line-end spacing that can be achieved by the corresponding lithography process, and hence may push the limit of line-end spacing to be lower. On the other hand, width W6 of metal lines 56 is not reduced since the spacers 32 are not laterally recessed. The sum of widths W6 and width W7 is also not reduced. Accordingly, the pushing of the line-end spacing does not sacrifice the line widths.

Figure 14:
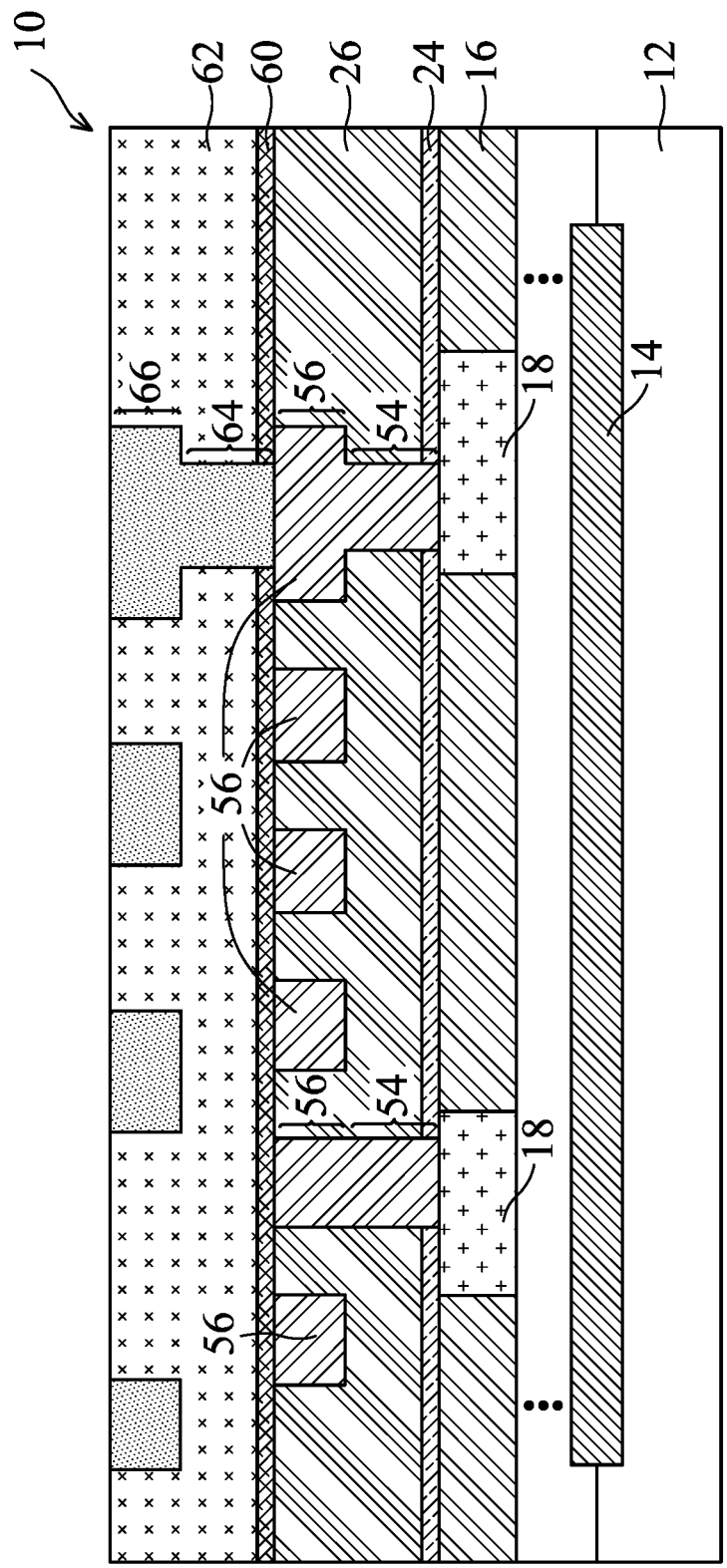
Figure 15:
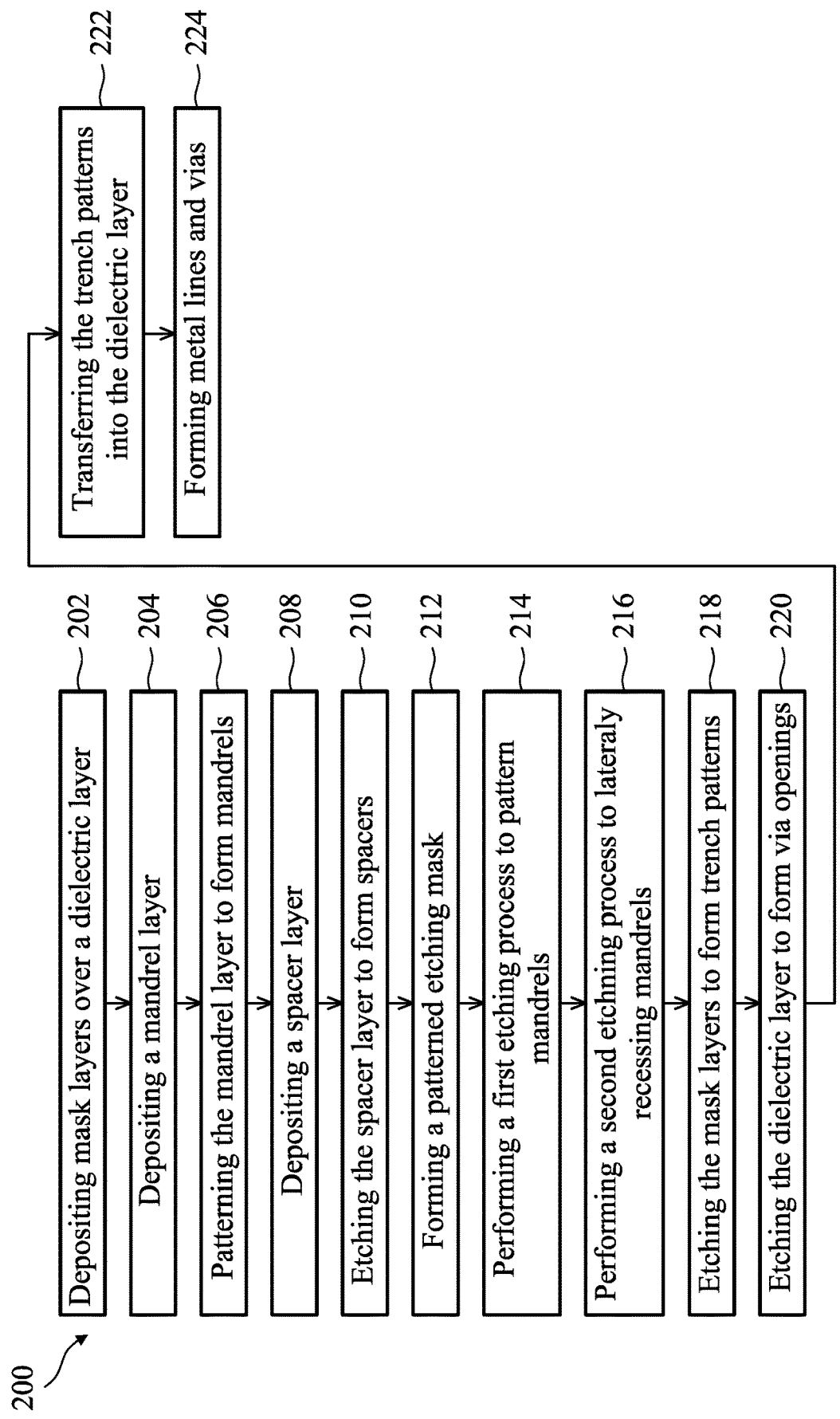
FIG. 15 illustrates a process flow for forming metal lines and vias in accordance with some embodiments.

FIG. 14 illustrates the formation of upper features, which includes etch stop layer 60, dielectric layer 62, vias 64, and metal lines 66. The formation of vias 64 and metal lines 66 may be similar to the formation of vias 54 and metal lines 56. It is appreciated, however, that the upper metal lines and vias may have greater spacings and widths than vias 54 and metal lines 56. The requirement of line-end spacing is thus relaxed. Accordingly, in the processes for etching the corresponding mandrel bridging portions (for forming metal lines 66), which processes correspond to the processes shown in FIGS. 6A, 6B, 7A, 7B, and 7C, the corresponding mandrel bridging portions are not laterally recessed, or substantially not laterally recessed, for example, with the lateral recessing distance of the mandrel bridging portions being smaller than about 0.2 nm or 0.1 nm.

The embodiments of the present disclosure have some advantageous features. By forming mandrels and spacers with high etching selectivity values, in the etching of mandrels, the mandrel bridge portions may be reduced, so that line-end spacings may be reduced. The spacers are not etched. Accordingly, line-end spacing may be reduced without causing the increase in line widths.

In accordance with some embodiments, a method comprises forming a first etching mask to cover a mandrel, a first spacer, and a second spacer, wherein the first spacer and the second spacer are in contact with opposing sidewalls of the mandrel; patterning the first etching mask, wherein after the patterning, the first etching mask comprises a first portion covering the first spacer; a second portion covering the second spacer; and a bridge portion connecting the first portion to the second portion, wherein the bridge portion comprises first sidewalls; performing a first etching process on the mandrel using the first etching mask to define pattern, wherein after the first etching process, the mandrel comprises a second bridge portion having second sidewalls vertically aligned to corresponding ones of the first sidewalls; and after the mandrel is etched-through, performing a second etching process to laterally recess the second bridge portion of the mandrel.

In an embodiment, in the second etching process, the first spacer and the second spacer are substantially not etched. In an embodiment, the first etching process lasts for a first duration, and the second etching process lasts for a second duration, and wherein the second duration is longer than the first duration. In an embodiment, in the second etching process, the mandrel has a first etching rate, the first spacer and the second spacer have a second etching rate, and wherein a ratio of the first etching rate to the second etching rate is greater than about 10. In an embodiment, the first etching process and the second etching process are performed using same process conditions.

In an embodiment, the first etching process and the second etching process are both anisotropic etching processes. In an embodiment, the first etching process and the second etching process are performed using different process conditions. In an embodiment, the first etching process and the second etching process are performed using same etching gases and different parameters. In an embodiment, the second etching process is more isotropic than the first etching process. In an embodiment, the first etching process is performed using a first bias power, and the second etching process is performed using a second bias power lower than the first bias power. In an embodiment, the first etching process and the second etching process are performed using different etching gases.

In accordance with some embodiments, a method comprises forming a mandrel between a first spacer and a second spacer; forming an etching mask comprising a first portion overlapping the first spacer; a second portion overlapping the second spacer; and a bridge portion overlapping the mandrel, wherein the mandrel comprises portions that are between the first spacer and the second spacer, with the portions being exposed through the etching mask; and etching the mandrel using the etching mask to define a pattern for the mandrel, wherein after the mandrel is etched, a remaining portion of the mandrel directly overlapped by the bridge portion comprises first sidewalls laterally recessed from second sidewalls of the bridge portion, and wherein when the mandrel is etched, both of the first sidewalls and the second sidewalls are exposed to an etching gas used for the etching.

In an embodiment, the first sidewalls are recessed from the corresponding second sidewalls by recessing distances greater than about 1 nm. In an embodiment, during the etching the mandrel, additional sidewalls of the first spacer and the second spacer are also exposed to the etching gas, and wherein the first spacer and the second spacer have third sidewalls vertically aligned to corresponding fourth sidewalls of the etching mask. In an embodiment, the method further comprises etching a mask layer underlying the mandrel, the first spacer, and the second spacer, wherein the second portion of the mandrel, the first spacer, and the second spacer are used collectively as a second etching mask; transferring patterns of the mask layer into a dielectric layer underlying the mask layer; and filling a conductive material into the dielectric layer to form a metal line. In an embodiment, the method further comprises depositing a spacer layer on a top surface and opposing sidewalls of the mandrel; and performing an anisotropic etching process on the spacer layer to form the first spacer and the second spacer.

In accordance with some embodiments, a method comprises forming a first spacer and a second spacer parallel to each other, wherein the first spacer and the second spacer have a distance from each other; forming a mandrel comprising a bridging portion between the first spacer and the second spacer, wherein the bridging portion comprises first opposing sidewalls physically contacting the first spacer and the second spacer, and wherein the bridging portion has a first width, with the first width being measured in a direction perpendicular to a lengthwise direction of the first spacer; and laterally recessing the first opposing sidewalls of the mandrel using an etching gas, so that the mandrel has a second width smaller than the first width, wherein during the laterally recessing, sidewalls of the first spacer and the second spacer are exposed to the etching gas, and wherein after the laterally recessing, the first spacer and the second spacer have the distance from each other. In an embodiment, the forming the bridging portion of the mandrel comprises a first anisotropic etching process. In an embodiment, the laterally recessing comprises a second anisotropic etching process. In an embodiment, the second anisotropic etching process has a duration longer than the first anisotropic etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first etching mask to cover a mandrel, a first spacer, and a second spacer, wherein the first spacer and the second spacer are in contact with opposing sidewalls of the mandrel;
   patterning the first etching mask, wherein after the patterning, the first etching mask comprises:
   a first portion covering the first spacer;
   a second portion covering the second spacer; and
   a bridge portion connecting the first portion to the second portion, wherein the bridge portion comprises first sidewalls;
   performing a first etching process on the mandrel using the first etching mask to define pattern, wherein after the first etching process, the mandrel comprises a second bridge portion having second sidewalls vertically aligned to corresponding ones of the first sidewalls; and
   after the mandrel is etched-through, performing a second etching process to laterally recess the second bridge portion of the mandrel.

2. The method of claim 1, wherein in the second etching process, the first spacer and the second spacer are substantially not etched.

3. The method of claim 1, wherein the first etching process lasts for a first duration, and the second etching process lasts for a second duration, and wherein the second duration is longer than the first duration.

4. The method of claim 1, wherein in the second etching process, the mandrel has a first etching rate, the first spacer and the second spacer have a second etching rate, and wherein a ratio of the first etching rate to the second etching rate is greater than about 10.

5. The method of claim 1, wherein the first etching process and the second etching process are performed using same process conditions.

6. The method of claim 5, wherein the first etching process and the second etching process are both anisotropic etching processes.

7. The method of claim 1, wherein the first etching process and the second etching process are performed using different process conditions.

8. The method of claim 7, wherein the first etching process and the second etching process are performed using same etching gases and different parameters.

9. The method of claim 8, wherein the second etching process is more isotropic than the first etching process.

10. The method of claim 8, wherein the first etching process is performed using a first bias power, and the second etching process is performed using a second bias power lower than the first bias power.

11. The method of claim 7, wherein the first etching process and the second etching process are performed using different etching gases.

12. A method comprising:
    forming a mandrel between a first spacer and a second spacer;
    forming an etching mask comprising:
    a first portion overlapping the first spacer;
    a second portion overlapping the second spacer; and
    a bridge portion overlapping the mandrel, wherein the mandrel comprises portions that are between the first spacer and the second spacer, with the portions being exposed through the etching mask; and
    etching the mandrel using the etching mask to define a pattern for the mandrel, wherein after the mandrel is etched, a remaining portion of the mandrel directly overlapped by the bridge portion comprises first sidewalls laterally recessed from second sidewalls of the bridge portion, and wherein when the mandrel is etched, both of the first sidewalls and the second sidewalls are exposed to an etching gas used for the etching.

13. The method of claim 12, wherein the first sidewalls are recessed from the corresponding second sidewalls by recessing distances greater than about 1 nm.

14. The method of claim 12, wherein during the etching the mandrel, additional sidewalls of the first spacer and the second spacer are also exposed to the etching gas, and wherein the first spacer and the second spacer have third sidewalls vertically aligned to corresponding fourth sidewalls of the etching mask.

15. The method of claim 12 further comprising:
    etching a mask layer underlying the mandrel, the first spacer, and the second spacer, wherein the second portion of the mandrel, the first spacer, and the second spacer are used collectively as a second etching mask;
    transferring patterns of the mask layer into a dielectric layer underlying the mask layer; and
    filling a conductive material into the dielectric layer to form a metal line.

16. The method of claim 12 further comprising:
    depositing a spacer layer on a top surface and opposing sidewalls of the mandrel; and
    performing an anisotropic etching process on the spacer layer to form the first spacer and the second spacer.

17. A method comprising:
    forming a first spacer and a second spacer parallel to each other, wherein the first spacer and the second spacer have a distance from each other;
    forming a mandrel comprising a bridging portion between the first spacer and the second spacer, wherein the bridging portion comprises first opposing sidewalls physically contacting the first spacer and the second spacer, and wherein the bridging portion has a first width, with the first width being measured in a direction perpendicular to a lengthwise direction of the first spacer; and
    laterally recessing the first opposing sidewalls of the mandrel using an etching gas, so that the mandrel has a second width smaller than the first width, wherein during the laterally recessing, sidewalls of the first spacer and the second spacer are exposed to the etching gas, and wherein after the laterally recessing, the first spacer and the second spacer have the distance from each other.

18. The method of claim 17, wherein the forming the bridging portion of the mandrel comprises a first anisotropic etching process.

19. The method of claim 18, wherein the laterally recessing comprises a second anisotropic etching process.

20. The method of claim 19, wherein the second anisotropic etching process has a duration longer than the first anisotropic etching process.

* * * * *